United States Patent
Lewis et al.

(10) Patent No.: US 10,878,146 B2
(45) Date of Patent: *Dec. 29, 2020

(54) HANDOVER TECHNIQUES FOR SIMULATION SYSTEMS AND METHODS

(71) Applicant: Improbable Worlds Limited, London (GB)

(72) Inventors: Matthew John Reveley Lewis, London (GB); Andrew Lee Seng Yin, London (GB)

(73) Assignee: Improbable Worlds Ltd, London (GB)

( * ) Notice: Subject to any disclaimer, the term of this patent is extended or adjusted under 35 U.S.C. 154(b) by 229 days.

This patent is subject to a terminal disclaimer.

(21) Appl. No.: 15/795,322

(22) Filed: Oct. 27, 2017

(65) Prior Publication Data

US 2018/0068040 A1     Mar. 8, 2018

Related U.S. Application Data

(63) Continuation-in-part of application No. 15/361,874, filed on Nov. 28, 2016, now Pat. No. 10,025,892.

(Continued)

(51) Int. Cl.
*G06F 30/20* (2020.01)
*G06F 9/50* (2006.01)
*G06Q 10/06* (2012.01)

(52) U.S. Cl.
CPC ............ *G06F 30/20* (2020.01); *G06F 9/5061* (2013.01); *G06Q 10/0633* (2013.01);
(Continued)

(58) Field of Classification Search
CPC .............................. G06F 17/5009; G06F 30/20
(Continued)

(56) References Cited

U.S. PATENT DOCUMENTS

| | | | |
|---|---|---|---|
| 5,173,939 A | 12/1992 | Abadi et al. | |
| 6,826,523 B1 | 11/2004 | Guy et al. | |

(Continued)

FOREIGN PATENT DOCUMENTS

| | | |
|---|---|---|
| CN | 101005514 A | 7/2007 |
| CN | 101582850 A | 11/2009 |
| WO | 9944130 A1 | 9/1999 |

OTHER PUBLICATIONS

Carlos Eduardo Benevides Bezerra et al. "A load balancing scheme for massively multiplayer online games" Multimedia Tools and Applications, May 21, 2009 pp. 1-27.

(Continued)

*Primary Examiner* — Bijan Mapar
(74) *Attorney, Agent, or Firm* — Banner & Witcoff, Ltd.

(57) ABSTRACT

Methods, systems, computer-readable media, and apparatuses for performing, providing, managing, executing, and/or running a spatially-optimized simulation are presented. In one or more aspects, authority over one or more components may be changed from one worker to another worker during the simulation. The components may be configured to, for example, indicate behaviors of entities executing in the simulation. The system may determine to hand over authority over the one or more components to another worker, such as based on network and/or simulation conditions. The incumbent worker may be notified that authority will change to another worker, e.g., after a period of time. Authority over the one or more components may be assigned to the other worker, and the incumbent worker may be notified that it is no longer authoritative over the one or more components. The second worker may be notified that it is now authoritative over the one or more components.

20 Claims, 14 Drawing Sheets

Related U.S. Application Data

(60) Provisional application No. 62/378,715, filed on Aug. 24, 2016.

(52) U.S. Cl.
CPC .............. *G06Q 10/063116* (2013.01); *G06Q 10/06312* (2013.01); *G06Q 10/063114* (2013.01)

(58) Field of Classification Search
USPC ........................................................ 703/21
See application file for complete search history.

(56) References Cited

U.S. PATENT DOCUMENTS

| | | | |
|---|---|---|---|
| 7,076,493 | B2 | 7/2006 | Myers et al. |
| 7,383,253 | B1 | 6/2008 | Tsimelzon et al. |
| 7,853,615 | B2 | 12/2010 | Liu et al. |
| 9,239,739 | B2 | 1/2016 | Semin et al. |
| 10,025,892 | B2 * | 7/2018 | Whitehead .......... G06F 17/5009 |
| 10,146,877 | B1 | 12/2018 | Zolnieryk et al. |
| 2012/0179855 | A1 | 7/2012 | Tsirkin et al. |
| 2012/0317624 | A1 | 12/2012 | Monjas Llorente et al. |
| 2013/0304903 | A1 | 11/2013 | Mick et al. |
| 2014/0157259 | A1 | 6/2014 | Dow et al. |
| 2014/0379775 | A1 | 12/2014 | Korangy et al. |
| 2016/0293133 | A1 | 10/2016 | Dutt |
| 2017/0180338 | A1 | 6/2017 | Hanatani et al. |
| 2018/0060138 | A1 | 3/2018 | Whitehead et al. |
| 2018/0060461 | A1 | 3/2018 | Whitehead et al. |
| 2018/0060462 | A1 | 3/2018 | Whitehead et al. |
| 2019/0045232 | A1 | 2/2019 | Sharif-Ahmadi et al. |
| 2019/0377672 | A1 * | 12/2019 | Ante .................. G06F 12/0223 |

OTHER PUBLICATIONS

Ta Nguyen Binh Duong et al. "A Dynamic Load Sharing Algorithm for Massively Multiplayer Online Games" School of Computer Engineering, Nanyang Technological University, Singapore 639798, IEEE 2003, pp. 131-136.

Morse, K., et al. "Interest Management in Large-Scale Virtual Environments" Presence, vol. 9, No. 1, pp. 52-68 (2000) (Year: 2000).

GameHorizon 2014—Games Development: A Different Path (Herman Narula, Improbable) http://www.youtube.com/watch?v=1fpaoKLxSE4 Jun. 3, 2014 (pp. 1-3).

Unity3D White Paper "A Guide to Moving From Internal Game Engine Technology" Oct. 16, 2015 (pp. 1-28).

Feb. 27, 2017—(US) Office Action—U.S. Appl. No. 15/361,874 (pp. 1-11).

Apr. 21, 2017—(US) Office Action—U.S. Appl. No. 15/361,874 (pp. 1-12).

Masaki Kohana, "Dynamic Data Allocation Method for Web-Based Multiserver Systems," Jan. 1, 2012. (pp. 1-74).

Roman Chertov et al., "Optimistic Load Balancing in a Distributed Virtual Environment," Network and Operating Systems Support for Digital Audio and Video, May 26, 2006. (pp. 1-6).

Fengyun Lu et al., "Load Balancing for Massively Multiplayer Online Games," The 5th Workshop on Network & System Support for Games 2006—Netgames 2006. (pp. 1-11).

"What We Found When We Simulated the Backbone of the Entire Internet on SpatialOS" Published Mar. 24, 2016, https://improbable.io/company/news/2016/03/24/what-we-found-when-we-simulated-the-backbone-of-the-entire-internet-on-spatialos (pp. 1-10).

Jul. 4, 2017 (WO) International Search Report and Written Opinion—PCT/GB2017/051231 (pp. 1-11).

Feb. 12, 2018 (US) Final Office Action—U.S. Appl. No. 15/361,874 (pp. 1-10).

May 17, 2018 (US) Notice of Allowance—U.S. Appl. No. 15/361,874 (pp. 1-10).

Sep. 14, 2018—(US) Non-Final Office Action—U.S. Appl. No. 15/361,921 (pp. 1-33).

Jan. 2, 2019—(US) Non-Final Office Action—U.S. Appl. No. 15/361,889 (pp. 1-21).

Dec. 13, 2018—(CN) Office Action—App 201780038250 (pp. 1-20).

Dec. 5, 2018—(US) Office Action—U.S. Appl. No. 15/361,921 (pp. 1-24).

Jan. 2, 2019—(US) Office Action—U.S. Appl. No. 15/361,889 (pp. 1-21).

Feb. 21, 2019—(US) Non-Final Office Action—U.S. Appl. No. 16/134,372 (pp. 1-25).

Ricci, L. & Carlini, E. "Distributed Virtual Environments: From Client Server to Cloud and P2P Architectures" IEEE Int'l Conf. on High Performance Computing & Simulation (2012) available from <https://ieeexplore.ieee.org/document/6266885> (Year: 2012) (pp. 1-1).

Smed, J., T. Kaukoranta, & H. Hakonen, "A Review on Networking and Multiplayer Computer Games" TUCS Technical Report No. 454 (2002) (Year: 2002) (pp. 1-30).

Ali, A. et al. "An Overview of Networking Infrastructure for Massively Multiplayer Online Games" (2013) available at (https://pdfs.semanticscholar.org/887b/374b1010ca23a0lbb89b71e40fd31e34ce92.pdf> (Year: 2013) (pp. 1-10).

Feb. 26, 2019—(US) Non-Final Office Action—U.S. Appl. No. 16/054,102 (pp. 1-19).

Feb. 5, 2019 (PCT)—Search Report and Written Opinion—App. PCT/GB2018/053058 (pp. 1-13).

Mar. 18, 2019—(US) Notice of Allowance—U.S. Appl. No. 15/361,921 (pp. 1-11).

Mar. 27, 2019—(US) Notice of Allowance—U.S. Appl. No. 16/054,135 (pp. 1-22).

Feb. 28, 2019 (CN)—Second Office Action—App. 2017800028250 (pp. 1-8 of original document; pp. 1-10 of translated document).

May 16, 2019—(US) Non-Final Office Action—U.S. Appl. No. 16/054,038 (pp. 1-27).

Jul. 9, 2019—(US) Final Office Action—U.S. Appl. No. 16/054,102 (pp. 1-28).

May 20, 2019—(CN) Notice of Allowance—App. 201780003825.0 (pp. 1-1).

Aug. 21, 2019—(US) Non-Final Office Action—U.S. Appl. No. 16/008,125—pp. 1-26.

Sep. 26, 2019—(US) Notice of Allowance—U.S. Appl. No. 16/054,038 (pp. 1-15).

Aug. 30, 2019—(US) Notice of Allowance—U.S. Appl. No. 16/134,372 (pp. 1-22).

* cited by examiner

HANDOVER TECHNIQUES FOR SIMULATION SYSTEMS AND METHODS

CROSS REFERENCE TO RELATED CASES

This application is a continuation-in-part of pending U.S. patent application Ser. No. 15/361,874, filed Nov. 28, 2016 and entitled "Simulation Systems and Methods," which claims priority to U.S. provisional application No. 62/378,715, filed Aug. 24, 2016, entitled "Simulation Systems and Methods," by Robert James Frederick Whitehead et al. The prior applications are incorporated herein by reference in their entirety.

FIELD

Aspects described herein generally relate to computers, networking, hardware, and software. More specifically, some aspects described herein relate to a networked system architecture for controlling a distributed and persistent spatially-optimized computer-based simulation, including load balancing of network nodes thereon, and a communications interface facilitating the instantiation, development, administration, and management of the computer-based simulation.

BACKGROUND

Conventional simulation systems are unable to scale to support very large numbers of objects to simulate those objects in real-time. Such systems have typically relied on a single instance of a simulation engine, running on a single physical or virtual computer system, to simulate the entire simulated world. Consumers of these simulation systems have had to choose between correctness, graphical fidelity, and real-time-interaction, with no solution offering the ability for all three on a large scale system. The magnitude and complexity of the situation is further increased if the consumer desires to simulate complex real-world problems which may require more computing power than a single simulation engine can provide. For example, a simulation of a city may require simulation of a large number of vehicles, pedestrians, bicyclists, traffic patterns, traffic lights, subway systems, transit vehicles, airplanes, and a multitude of other entities that affect and contribute to city life.

In one known approach, computing resources have been statically assigned to a portion of the simulated world. A disadvantage of this approach may be that as the simulated objects, actors, etc. move across the simulated world as the simulation progresses, the simulated objects may congregate on a very small region of the simulated world. If sufficient objects move to the very small region, the computing resources may be overloaded (resulting in slower processing), the simulation may terminate unexpectedly, and/or simulation data may be lost. Another disadvantage of this approach may be that state information of the simulation for a region may be concentrated on a single computing resource and may not be shared or spread across several resources, making fault tolerance or recovery from an unexpected termination difficult and time-consuming. In addition, this approach may not lend itself to easily support stateful migration of simulated objects across region boundaries, and thus simulations usually limit stateful migrations to only players.

These and other problems are addressed herein.

SUMMARY

The following presents a simplified summary of various aspects described herein. This summary is not an extensive overview, and is not intended to identify key or critical elements or to delineate the scope of the claims. The following summary merely presents some concepts in a simplified form as an introductory prelude to the more detailed description provided below.

To overcome limitations in the prior art described above, and to overcome other limitations that will be apparent upon reading and understanding the present specification, aspects described herein are directed towards a distributed, persistent, and spatially-optimized simulation development environment. Other aspects described herein may allow for the integration of existing non-distributed simulation programs into a large-scale distributed simulation. Yet other aspects described herein may be used to automatically and spatially balance and distribute the simulation workload. One or more application programming interfaces (API) may be used to communicate between administrative and simulation modules.

In accordance with one or more aspects, there is provided a spatially-optimized simulation system having at least one processor, controlling some operations of the system, and a memory may comprise a plurality of entities being simulated. Each one of the entities being simulated may, for example, comprise one or more components, and each of the components may comprise one or more properties. The spatially-optimized simulation system may comprise a plurality of worker modules and a plurality of bridge modules corresponding to the plurality of worker modules. The worker modules may be configured to perform the spatially-optimized simulation. In particular, each worker module of the plurality of worker modules may each instantiate a subset of the plurality of entities being simulated. The worker modules may be further configured to update one or more properties of a portion of the entities being simulated by the particular worker module. In some instances, the plurality of bridge modules may be configured for communicating with the plurality of worker modules. In other instances, the spatially-optimized simulation system may comprise a plurality of chunk modules. The chunk modules may be configured to monitor a group of entities assigned to the particular chunk module. In particular, the group of entities assigned to the chunk module may be located within a chunk region assigned to the particular chunk module. The spatially-optimized simulation system may comprise at least one receptionist module configured to receive requests from a plurality of client worker modules for connecting to the spatially-optimized simulation system. In particular, the receptionist module may be configured to assign a corresponding bridge module of the plurality of bridge modules for communicating with each client worker module in response to the receiving of the request. In some instances, the spatially-optimized simulation system may comprise at least one oracle module configured for assigning worker modules and bridge modules in response to requests received from chunk modules and from bridge modules.

The chunk regions assigned to chunk modules may be changed by assigning entities to a different chunk module, for example.

Optionally, the spatially-optimized simulation system may comprise a data store module configured for creating and maintaining a snapshot comprising a current state of each entity of the plurality of entities. In particular, the current state of each entity may comprise a current value for each property of the one or more properties comprised by the one or more components comprised by that entity. The plurality of chunk modules may be further configured to restore an entity using state information for the entity maintained by the data store module.

Optionally, the plurality of chunk modules may be further configured to migrate an entity from one chunk module to another chunk module. In particular, the migrating of an entity from one chunk module to another chunk module may comprise of: forwarding by the entity's state information, causing the destination chunk module to receive state change notifications from the entity, and stopping the source chunk module from receiving state change notifications from the entity. The migrating of the entity may be performed in response to a determination by the source chunk module based on a load balancing algorithm. Advantageously, the migrating of the entity may be performed in response to a determination by the entity being migrated based on its current spatial location or a determination of the entity's current spatial location.

Optionally, the receptionist module may be further configured to instantiate a bridge module prior to assigning the at least one bridge module for communicating with the client device. The receptionist module may be further configured to publish a predetermined network address for communicating with the receptionist module.

Optionally, the oracle module may be further configured to maintain a first database comprising data indicative of a state of each worker module of the plurality of worker modules, and to maintain a second database comprising data indicative of a state of each bridge module of the plurality of bridge modules. The oracle module may be further configured to assign a worker module to a chunk module in response to a request from the chunk module for a worker module.

Optionally, the client devices connecting to the spatially-optimized simulation system may be located in a plurality of different geographic locations.

Optionally, the bridge modules may be configured to communicate with the worker modules through an application programming interface (API) exposed by each bridge module.

In accordance with one or more aspects, there is provided a method for load-balancing may comprise determining a plurality of candidate computing modules for receiving a process to be transferred. The method may further comprise determining a load density center for each candidate computing module, determining a distance between the load density center for the first computing module and the load density center for each candidate computing module, and determining a transfer score for each candidate computing module. The method may further comprise selecting a computing module from the plurality of candidate computing modules based on a comparison of the transfer scores for each of the candidate computing modules. The method may further comprise transferring the process to the selected computing module.

In some instances, the determining the plurality of candidate computing modules may comprise selecting a plurality of other computing modules which subscribe to notifications transmitted by the process to be transferred.

In other instances, the determining the plurality of candidate computing modules may comprise eliminating at least one candidate computing module based on a determination of a load metric indicative of an instantaneous processing load on that candidate computing module.

Optionally, the method for determining the load density center for each candidate computing module may comprise determining a spatial center of mass based on a spatial position and processing load of a plurality of processes assigned to the candidate computing module.

Optionally, the method for determining the transfer score for each candidate computing module may comprise determining a tensile energy of the candidate computing module based on the distance between the load density center for the first computing module and the load density center for the candidate computing module and a predetermined spring factor. In some instances, the value of the predetermined spring factor may change based on a time factor. In other instances, the value of the predetermined spring factor may change based on the distance between the load density center for the first computing module and the load density center for the candidate computing module. In yet other instances, the method for selecting a computing module may comprise selecting a candidate computing module to minimize a tensile energy between the first computing module and second computing module.

Optionally, the method for transferring the process to the selected computing module may comprise transmitting state information of the process, causing the selected computing module to receive state change notifications from the process, and stopping the first computing module from receiving state change notifications from the process.

Optionally, a method for communicating with a worker module in a spatially-optimized simulation may comprise exposing a first Application Programming Interface (API) for adding an entity to the simulation, exposing a second API for removing the entity from the simulation, exposing a third API for notifying the worker module of a change in a state of a component, exposing a fourth API for delegating authority of the component, exposing a fifth API for removing delegation authority of the component, exposing a sixth API for setting delegation authority of the component, and exposing a seventh API for updating the state of a component that has delegated authority to the worker module.

Optionally, the first API may comprise a first parameter indicating the entity to be added and a second parameter indicating an initial state of the entity, and may trigger the addition of the entity to a spatial region assigned to the worker module.

Optionally, the second API may comprise a third parameter indicating the entity to be removed, and may trigger the removal of the entity from the spatial region assigned to the worker module.

Optionally, the third API may comprise a fourth parameter indicating the entity comprising the component to be modified and a fifth parameter indicating the state of the component, and may trigger the modification of the state of the entity in the simulation.

Optionally, the fourth API may comprise a sixth parameter indicating the entity comprising the component to be delegated and a seventh parameter indicating the component to be delegated, and may trigger the component to delegate authority to the worker module.

Optionally, the fifth API may comprise an eighth parameter indicating the entity comprising the component to be undelegated and a ninth parameter indicating the component to be undelegated, and may trigger the component to remove delegation authority from the worker module.

Optionally, the sixth API may comprise a tenth parameter indicating the entity comprising the component, an eleventh parameter indicating the component, and a twelfth parameter indicating to set delegation authority on the component, and may trigger the component to delegate authority to the worker module. Alternatively and additionally, the sixth API may comprise a tenth parameter indicating the entity comprising the component, an eleventh parameter indicating the component, and a twelfth parameter indicating to unset delegation authority on the component, and may trigger the component to remove delegation authority from the worker module.

Optionally, the seventh API may comprise a thirteenth parameter indicating the entity comprising the component to be updated and a fourteenth parameter indicating the state of the component, and may triggers the update of the state of the entity. The seventh API comprises a thirteenth parameter indicating the entity comprising the component to be updated and a fourteenth parameter indicating the state of the component, and may trigger the notification of a change in the state of the component.

In accordance with a further aspect, there may be provided a simulation system and method for simulating entities in a one or more dimensional virtual space, comprising: first computer means adapted to simulate entities virtually present in a first bounded part of the one or more dimensional virtual space, second computer means adapted to simulate entities virtually present in a second bounded part of the one or more dimensional virtual space different from the first bounded part of the one or more dimensional virtual space, wherein the first and second computer means are adapted to transfer the simulation of all entities virtually present in a third bounded part of the one or more dimensional virtual space from the first computer means to the second computer means, wherein the third bounded part of the one or more dimensional virtual space is a subset of the first bounded part of the one or more dimensional virtual space and is adjacent (e.g., in a virtual space) to the second bounded part of the one or more dimensional virtual space. Therefore, computer resources may be used more efficiently and processing loads may be balanced more effectively.

A spatially-optimized simulation may also be described as a computer implemented simulation of a one or more dimensional virtual space, wherein allocation of processing resources to perform simulation calculations may be based on a spatial distribution of simulated entities in the simulated virtual space.

A chunk region may also be described as a bounded part or region of a one or more dimensional virtual space.

A worker module may also be described as a software module implementing simulation functionality. This may be implemented as software code. The functionality may include any simulated process, device, or entity that may interact with its surroundings within the virtual space. Optionally, the functionality may include real-time and/or real-world behavior from real-world equivalents of the simulated entities.

A bridge module may also be described as a software module, which has a one-to-one relation with a worker module and is in communication with other modules of the system in order to exchange information between the other modules of the system and the worker module and/or to control the worker module. A bridge module may also be a communication, data or software interface. Other forms of communication may be used between worker modules or software processes, e.g., peer to peer communication.

A chunk module or chunk actor may be a software module, which may be allocated to a single server and which coordinates simulation of entities allocated to a chunk or bounded region.

A receptionist module may be a module that handles contact (or first contact) with outside entities or users wishing to gain access to or utilize the system and/or architecture.

Examples of entities being simulated may include:

The real world equivalent of the virtual representation of an entity (a person, car, traffic light, tree, rock, etc.) which may be used in real-world simulations involving outer space, a city, traffic, or the like;

The virtual representation of an entity, e.g., non-real-world environments, physics, objects, and/or fantastical creatures or being as may be used in a virtual world, game, or other simulated space; and/or A dataset on which a software module (e.g. the worker module) has access to simulate an entity, e.g., financial systems and/or markets, numerical modeling, statistical modeling, Monte Carlo simulations, and the like. These are merely examples, and any other real-world or non-real-world environment may be simulated using aspects described herein.

In accordance with one or more aspects, there is provided a method comprising assigning, by a computing device and to a first worker, authority over one or more components of a plurality of components. The plurality of components may be configured to indicate behaviors of a plurality of entities executing in a simulation associated with the computing device. The computing device may determine to hand over authority over the one or more components from the first worker to a second worker. In response to determining to hand over authority over the one or more components from the first worker to the second worker, the computing device may transmit, to the first worker, a message indicating that authority over the one or more components will change from the first worker to the second worker after a period of time. The computing device may assign, to the second worker, authority over the one or more components of the plurality of components. The computing device may transmit, to the first worker, a message indicating that the first worker is not authoritative over the one or more components. The computing device may transmit, to the second worker, a message indicating that the second worker is authoritative over the one or more components.

Optionally, transmitting the message indicating that the first worker is not authoritative over the one or more components and/or transmitting the message indicating that the second worker is authoritative over the one or more components may be performed after determining that the period of time has ended.

Optionally, the method may further comprise receiving, by the computing device and from the first worker, a message indicating that the first worker is ready to lose authority over the one or more components. The transmitting the message indicating that the first worker is not authoritative over the one or more components and/or the transmitting the message indicating that the second worker is authoritative over the one or more components may be performed in response to receiving the message indicating that the first worker is ready to lose authority over the one or more components.

Optionally, the message indicating that authority over the one or more components will change from the first worker to the second worker after the period of time may comprise an indication of an end time of the period of time.

Optionally, the method may further comprise after assigning, to the first worker, authority over the one or more components of the plurality of components and before determining to hand over authority over the one or more components from the first worker to the second worker, receiving, by the computing device and from the first worker, an update to the one or more components of the plurality of components. The computing device may store the update to the one or more components of the plurality of components. Optionally, the method may further comprise after determining that the period of time has ended, transmitting, by the computing device and to the second worker, the stored update to the one or more components of the plurality of components.

Optionally, the method may further comprise during the period of time, receiving, by the computing device and from the first worker, an update to the one or more components of the plurality of components, and/or storing, by the computing device, the update to the one or more components of the plurality of components. Optionally, after assigning, to the second worker, authority over the one or more components, the computing device may transmit, to the second worker, the stored update to the one or more components of the plurality of components.

Optionally, the method may further comprise receiving, by the computing device, data indicative of network conditions of a network associated with the simulation. Determining to hand over authority over the one or more components from the first worker to the second worker may be based on the network conditions of the network associated with the simulation.

Systems and non-transitory computer readable media may be configured to provide and/or support various aspects described herein. These and additional aspects will be appreciated with the benefit of the disclosures discussed in further detail below.

It should be noted that any one or more of the above-described features may be used with any other feature or aspect in isolation or any combination. Features from one embodiment or aspect may be interchanged or used together with one or more features of any other described embodiment or aspect.

BRIEF DESCRIPTION OF THE DRAWINGS

A more complete understanding of aspects described herein and the advantages thereof may be acquired by referring to the following description in consideration of the accompanying drawings, in which like reference numbers indicate like features, and wherein.

DETAILED DESCRIPTION

In the following description of the various embodiments, reference is made to the accompanying drawings identified above and which form a part hereof, and in which is shown by way of illustration various embodiments in which aspects described herein may be practiced. It is to be understood that other embodiments may be utilized and structural and functional modifications may be made without departing from the scope described herein. Various aspects are capable of other embodiments and of being practiced or being carried out in various different ways. Additionally, the phraseology and terminology used herein are for the purpose of description and should not be regarded as limiting. Rather, the phrases and terms used herein are to be given their broadest interpretation and meaning.

As will be appreciated by one of skill in the art upon reading the following disclosure, various aspects described herein may be embodied as a method, a computer system, or a computer program product. Accordingly, those aspects may take the form of an entirely hardware embodiment, an entirely software embodiment or an embodiment combining software and hardware aspects. Furthermore, such aspects may take the form of a computer program product stored by one or more computer-readable storage media having computer-readable program code, or instructions, embodied in or on the storage media. Any suitable computer-readable storage media may be utilized, including hard disks, CD-ROMs, optical storage devices, magnetic storage devices, and/or any combination thereof. Particular data structures may be used to more effectively implement one or more aspects described herein, and such data structures are contemplated within the scope of computer executable instructions and computer-usable data described herein. In addition, various signals representing data or events as described herein may be transferred between a source and a destination in the form of electromagnetic waves traveling through signal-conducting media such as metal wires, optical fibers, and/or wireless transmission media (e.g., air and/or space.)

As a general introduction to the subject matter described in more detail below, aspects described herein are directed towards systems, methods, and techniques for providing a distributed, persistent, and spatially-optimized simulation development environment. Other aspects described herein may allow for the integration of existing non-distributed simulation programs into a large-scale distributed simulation. Yet other aspects described herein may be used to automatically and spatially balance and distribute the simulation workload.

Figure 1:
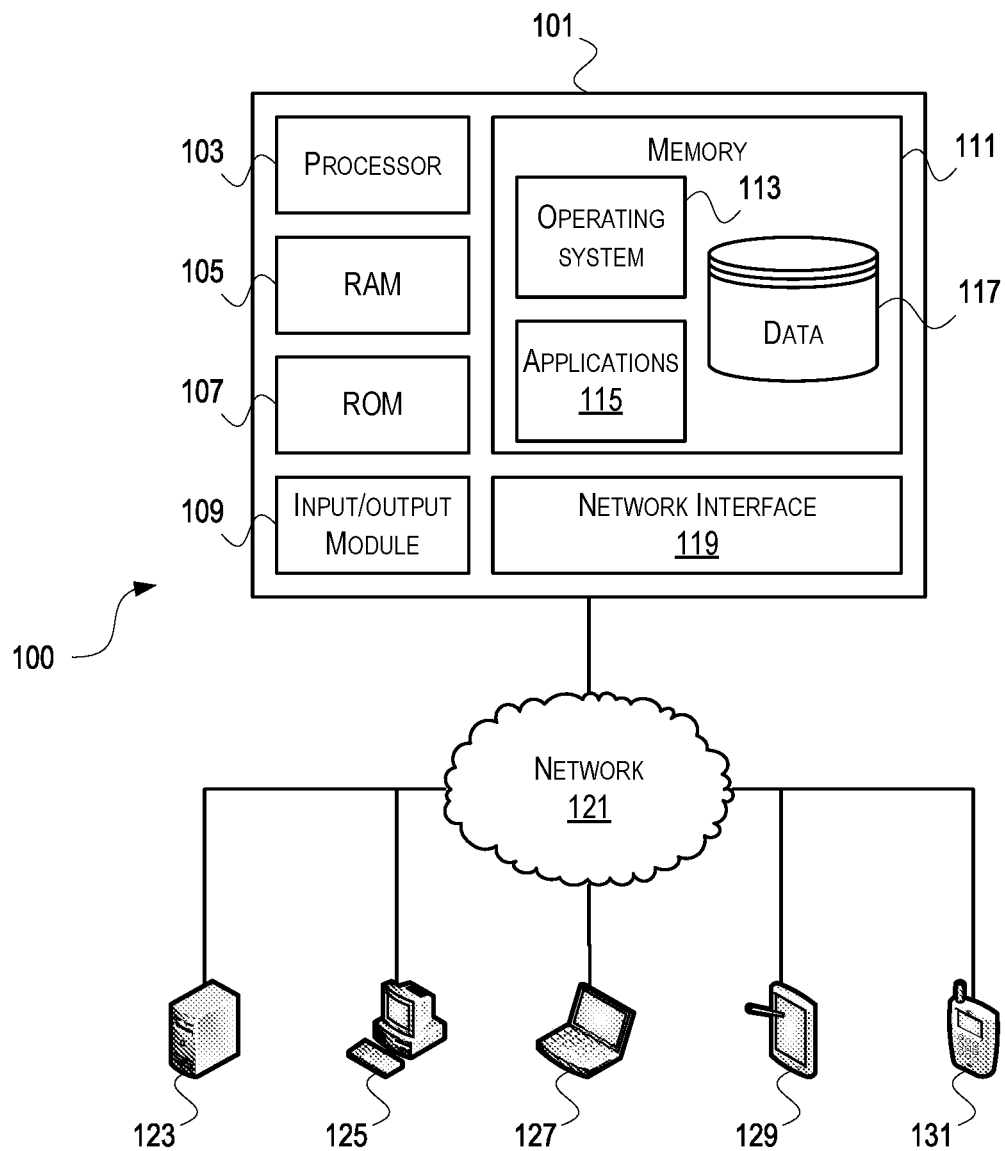
FIG. 1 depicts an illustrative computer system architecture that may be used in accordance with one or more illustrative aspects described herein.

Computer software, hardware, and networks may be utilized in a variety of different system environments, including standalone, networked, virtualized, and/or cloud-based environments, among others. FIG. 1 illustrates one example of a block diagram of a spatially-optimized simulation computing device (or system) 101 in a spatially-optimized simulation computing system 100 that may be used according to one or more illustrative embodiments of the disclosure. The spatially-optimized simulation computing device 101 may comprise a processor 103 for controlling overall operation of the spatially-optimized simulation computing device 101 and its associated components, including RAM 105, ROM 107, input/output module 109, and memory 111. The spatially-optimized simulation computing device 101, along with one or more additional computing devices (e.g., network nodes 123, 125, 127, 129, and 131) may correspond to any one of multiple systems or devices described herein, such as personal mobile devices, client computing devices, proprietary simulation systems, additional external servers and other various devices in a spatially-optimized simulation computing system 100. These various computing systems may be configured individually or in combination, as described herein, for providing a spatially-optimized simulation computing system 100. In addition to the features described above, the techniques described herein also may be used for allowing integration of existing simulation programs, and for spatially load-balancing the simulation workload across the spatially-optimized simulation computing system 100, as will be discussed more fully herein. Those of skill in the art will appreciate that the functionality of spatially-optimized simulation computing device 101 (or devices 123, 125, 127, 129, and 131) as described herein may be spread across multiple processing devices, for example, to distribute processing load across multiple computers, to segregate transactions based on processor load, location within a simulated world, user access level, quality of service (QoS), and the like.

The various network nodes 123, 125, 127, 129, and 131 may be interconnected via a network 121, such as the Internet. Other networks may also or alternatively be used, including private intranets, corporate networks, local area networks (LAN), wide area networks (WAN), metropolitan area networks (MAN), wireless networks, personal networks (PAN), and the like. Network 121 is for illustration purposes and may be replaced with fewer or additional computer networks. Network 121 may have one or more of any known network topology and may use one or more of a variety of different protocols, such as Ethernet. Devices 123, 125, 127, 129, 131, and other devices (not shown) may be connected to one or more of the networks via twisted pair wires, coaxial cable, fiber optics, radio waves, or other communication media.

It will be appreciated that the network connections shown are illustrative and other means of establishing a communications link between the computers may be used. The existence of any of various network protocols such as TCP/IP, Ethernet, FTP, HTTP and the like, and of various wireless communication technologies such as GSM, CDMA, Wi-Fi, and WiMAX, is presumed, and the various computing devices in spatially-optimized simulation system components described herein may be configured to communicate using any of these network protocols or technologies.

The term "network" as used herein and depicted in the drawings refers not only to systems in which remote computing devices are coupled together via one or more communication paths, but also to stand-alone devices that may be coupled, from time to time, to such systems that have storage capability. Consequently, the term "network" includes not only a "physical network" but also a "content network," which is comprised of the data which resides across all physical networks.

The Input/Output (I/O) module 109 may include a microphone, keypad, touch screen, game controller, joystick, and/or stylus through which a user of the spatially-optimized simulation computing device 101 may provide input, and may also include one or more of a speaker for providing audio output and a video display device for providing textual, audiovisual and/or graphical output. Software may be stored within memory 111 and/or storage to provide instructions to processor 103 for enabling a spatially-optimized simulation computing device 101 to perform various actions. For example, memory 111 may store software used by a spatially-optimized simulation computing device 101, such as an operating system 113, application programs 115, and an associated internal database 117. The database 117 may include a second database (e.g., as a separate table, report, etc.) That is, the information may be stored in a single database, or separated into different logical, virtual, or physical databases, depending on system design. The various hardware memory units in memory 111 may include volatile and nonvolatile, removable and non-removable media implemented in any method or technology for storage of information such as computer-readable instructions, data structures, program modules, or other data. Spatially-optimized simulation computing device 101 and/or computing devices 127, 129, 131 may also be mobile terminals (e.g., mobile phones, smartphones, personal digital assistants (PDAs), notebooks, etc.) including various other components, such as a battery, speaker, and antennas (not shown.)

Aspects described herein may also be operational with numerous other general purpose or special purpose computing system environments or configurations. Examples of other computing systems, environments, and/or configurations that may be suitable for use with aspects described herein include, but are not limited to, personal computers, server computers, hand-held or laptop devices, vehicle-based computing devices, multiprocessor systems, microprocessor-based systems, programmable consumer electronics, network personal computers (PCs), minicomputers, mainframe computers, distributed computing environments that include any of the above systems or devices, and the like.

Figure 2:
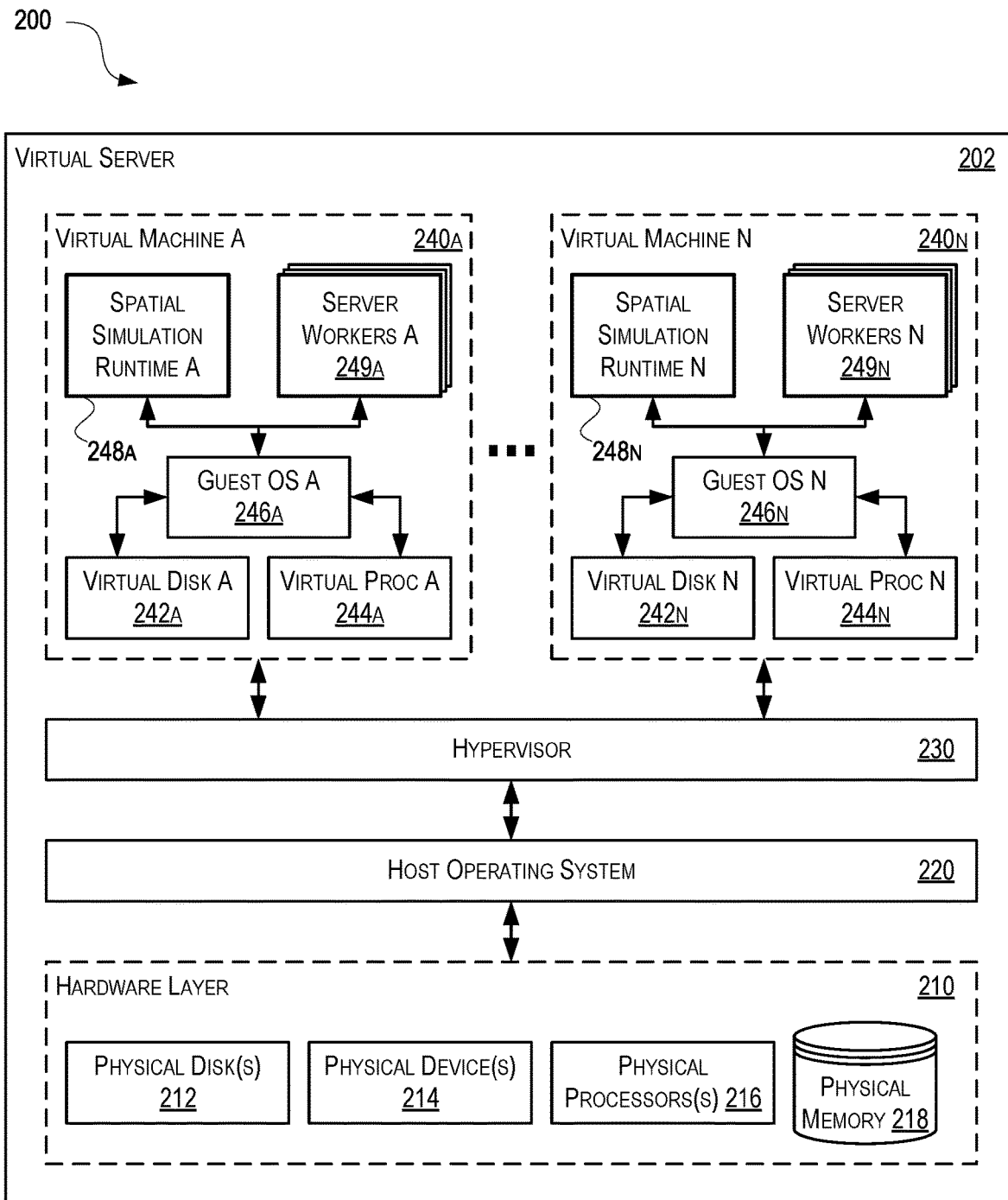
FIG. 2 depicts an illustrative virtualized (hypervisor) system architecture that may be used in accordance with one or more illustrative aspects described herein.

FIG. 2 shows a high-level architecture of an illustrative spatially-optimized simulation system. As shown, the spatially-optimized simulation system 200 may be a single server system, a multi-server system, or a cloud-based system, including at least one virtual server 202 which may be configured to provide spatially-optimized simulation functionality to the spatially-optimized simulation system 200 and/or may provide access to the spatially-optimized simulation system 200 to one or more client computing devices (e.g., computing devices 123, 125, 127, 129, 131.) A virtual server 202 may comprise one or more virtual machines 240a-240n (generally referred to herein as "virtual machine(s) 240"). Each virtual machine 240 may comprise an instance of a spatial simulation runtime 248 for instantiating, managing, and monitoring one or more instances of server worker processes 249a-249n (generally referred to herein as "worker(s) 249.") As described in further detail below, the spatial simulation runtime 248 may be configured to automatically spool up or spool down workers 249, as needed, based on the instantaneous workload of particular regions of the simulated world generated by the spatially-optimized simulation system.

The one or more instances of the spatial simulation runtime 248 within a virtual server 202 may communicate with each other to determine an instance which may serve as a master. For example, the spatial simulation runtime 248 instances may utilize a consensus protocol to determine a master. A master spatial simulation runtime 248 instance may be responsible for routing communications between the other spatial simulation runtime 248 instances within the virtual server 202 and other spatial simulation runtimes 248 executing in other virtual servers 202. As will be explained in greater detail below, the spatial simulation runtime 248 may allow for spatially-optimized distributed simulations where simulation workload is automatically distributed across available virtual server(s) 202. The virtual server 202 illustrated in FIG. 2 may be deployed as and/or implemented by one or more embodiments of the spatially-optimized simulation computing device 101 illustrated in FIG. 1 or by other known computing devices.

The virtual server 202 may comprise a hardware layer 210 with one or more hardware elements that communicate with the virtual server 202. Optionally, the hardware layer 210 may comprise one or more physical disks 212, one or more physical devices 214, one more physical processors 216, and one or more physical memories 218. Physical components 212, 214, 216, and 218 may include, for example, any of the components described above with respect to spatial simulation computing device 101. In one example, physical devices 214 may include a network interface card, a video card, a keyboard, a mouse, an input device, a monitor, a display device, speakers, an optical drive, a storage device, a universal serial bus connection, a printer, a scanner, a network element (e.g., router, firewall, network address translator, load balancer, virtual private network (VPN) gateway, Dynamic Host Configuration Protocol (DHCP) router, etc.), or any device connected to or communicating with virtualization server 301. Physical memory 218 may include any type of memory. In another example, physical memory 218 may store data, and may store one or more programs, or set of executable instructions. Programs or executable instructions stored in the physical memory 218 may be executed by the one or more processors 216 of virtual server 202. Virtual server 202 may further comprise a host operating system 220 which may be stored in a memory element in the physical memory 218 and may be executed by one or more of the physical processors 216.

Hypervisor 230 may provide virtual resources to operating systems 246a-246n or to workers 249 executing on virtual machines 240 in any manner that simulates the operating systems 246 or workers 249 having direct access to system resources. System resources may include, but are not limited to, physical disks 212, physical devices 214, physical processors 216, physical memory 218, and any other component included in hardware layer 210. Hypervisor 230 may be used to emulate virtual hardware, partition physical hardware, virtualize physical hardware, and/or execute virtual machines that provide computing resources to spatial simulation runtime 248 and workers 249. Hypervisor 230 may control processor scheduling and memory partitioning for a virtual machine 240 executing on virtual server 202.

Hypervisor 230 may be Type 2 hypervisor, where the hypervisor may execute within a host operating system 220 executing on the virtual server 202. Virtual machines 240 may then execute at a level above the hypervisor 230. The Type 2 hypervisor may execute within the context of a host operating system 220 such that the Type 2 hypervisor interacts with the host operating system 220. One or more virtual server 202 in a spatial simulation system 200 may instead include a Type 1 hypervisor (not shown.) A Type 1 hypervisor may execute on a virtual server 202 by directly accessing the hardware and resources within the hardware layer 210. That is, while a Type 2 hypervisor 230 may access system resources through a host operating system 220, as shown, a Type 1 hypervisor may directly access all system resources without the host operating system 220. A Type 1 hypervisor 230 may execute directly on one or more physical processors 316 of virtual server 202, and may include program data stored in the physical memory 318.

The spatial simulation runtime 248 may cause the hypervisor 230 to create one or more virtual machines 240 in which additional spatial simulation runtime 248 and worker 249 instances may execute within guest operating systems 246. Hypervisor 230 may load a virtual machine image to create a virtual machine 240. The hypervisor 230 may execute a guest operating system 246 within virtual machine 240. Virtual machine 240 may execute guest operating system 246.

In addition to creating virtual machines 240, hypervisor 230 may control the execution of at least one virtual machine 240. Hypervisor 230 may present at least one virtual machine 240 with an abstraction of at least one hardware resource provided by the virtual server 202 (e.g., any hardware resource available within the hardware layer 210.) Hypervisor 230 may control the manner in which virtual machines 240 may access physical processors 216 available in virtual server 202. Controlling access to physical processors 216 may include determining whether a virtual machine 240 should have access to a processor 216, and how physical processor capabilities are presented to the virtual machine 240.

As shown in FIG. 2, virtual server 202 may host or execute one or more virtual machines 240. A virtual machine 240 is a set of executable instructions that, when executed by a processor 216, imitate the operation of a physical computer such that the virtual machine 240 may execute programs and processes much like a physical computing device. While FIG. 2 illustrates an embodiment where a virtual server 202 hosts two virtual machines 240, in other embodiments virtual server 202 may host any number of virtual machines 240. Hypervisor 230 may provide each virtual machine 240 with a unique virtual view of the physical hardware, memory, processor, and other system resources available to that virtual machine 240. Optionally, hypervisor 230 may provide each virtual machine 240 with a substantially similar virtual view of the physical hardware, memory, processor, and other system resources available to the virtual machines 240.

Each virtual machine 240 may include a virtual disk 242a-242n (generally 242) and a virtual processor 244a-244n (generally 244.) The virtual disk 242 may be a virtualized view of one or more physical disks 212 of the virtual server 202, or may be a portion of one or more physical disks 212 of the virtual server 202. The virtualized view of the physical disks 212 may be generated, provided, and managed by the hypervisor 230. Hypervisor 230 may provide each virtual machine 240 with a unique view of the physical disks 212. Thus, the particular virtual disk 242 included in each virtual machine 240 may be unique when compared with the other virtual disks 240.

A virtual machine 240*a*-240*n* may execute, using a virtual processor 244*a*-244*n*, one or more workers 249*a*-249*n* using a guest operating system 246*a*-246*n*. The guest operating system 246 may be any one of the following non-exhaustive list of operating systems: WINDOWS, UNIX, LINUX, iOS, ANDROID, SYMBIAN. Guest operating system 246 may be a purpose-built operating system based on one or more of the aforementioned operating systems. For example, guest operating system 246 may consist of a purpose-built version of LINUX which may comprise only the functional modules necessary to support operation of the workers 249. Optionally, and as described in further detail below, a virtual machine 240*a*-240*n* may execute one or more bridge modules (not shown) corresponding to the one or more workers 249*a*-249*n* executing in the virtual machine 240*a*-240*n*. A virtual machine 240*a*-240*n* may also host one or more chunk modules (not shown), a receptionist module (not shown), and an oracle module (not shown.)

FIG. 2 illustrates just one example of a spatially-optimized simulation system that may be used, and those of skill in the art will appreciate that the specific system architecture and computing devices used may vary, and are secondary to the functionality that they provide, as further described herein.

Figure 3:
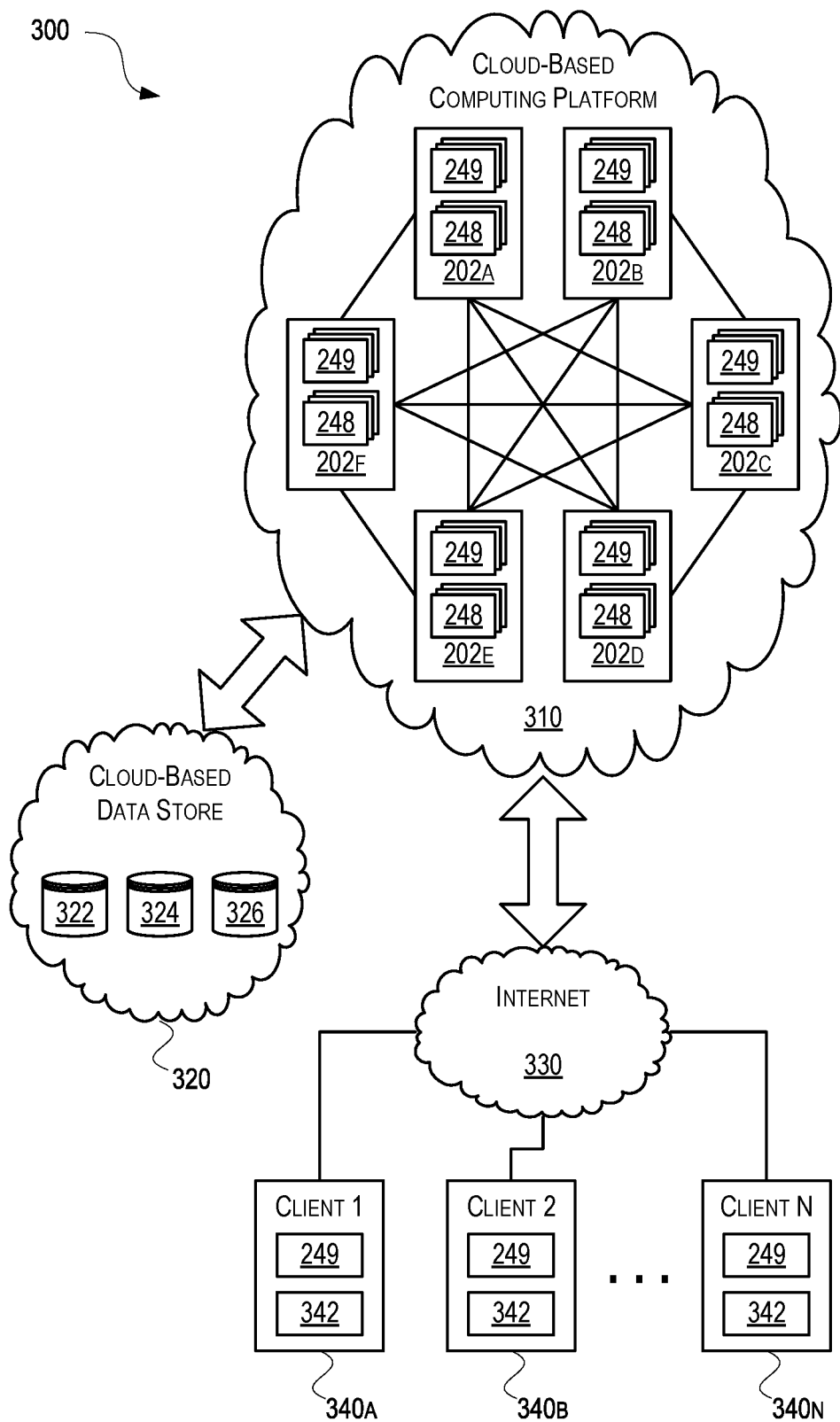
FIG. 3 depicts an illustrative cloud-based system architecture that may be used in accordance with one or more illustrative aspects described herein.

Referring to FIG. 3, some aspects described herein may be implemented in a cloud-based environment. FIG. 3 illustrates an example of a spatially-optimized simulation environment (e.g., a development environment) based on a cloud-based computing platform system 300. As shown in FIG. 3, client computing devices 340*a*-340*n* (generally 340) may communicate via the Internet 330 to access the spatially-optimized simulation executing on the virtual servers 202 (e.g., spatial simulation runtime 248, server workers 249, bridge modules (not shown), chunk modules (not shown), receptionist module (not shown), and an oracle module (not shown)) of the cloud-based computing platform 310.

The spatial simulation runtime 248 contains the program code to implement the elements and components which comprise the spatially-optimized simulation environment, as described in further detail herein. For example, the spatial simulation runtime 248 may comprise implementation code for one or more of the bridge modules, chunk modules, receptionist module, and oracle module of the cloud-based computing platform 310, as further described herein and as illustratively shown in FIG. 11, as well as provide worker management functions (starting processes, stopping processes, etc.). Additionally and alternatively, the spatial simulation runtime 248 may also expose an application programming interface (API) which may be utilized to monitor status, instantaneously and/or periodically, of the spatially-optimized simulation environment. The monitoring API may also be utilized to debug the status and behavior of the spatially-optimized simulation environment. In an illustrative embodiment, the spatial simulation runtime 248 may be implemented as a JAR (Java ARchive).

The cloud-based computing platform 310 may comprise private and/or public hardware and software resources and components. For example, a cloud may be configured as a private cloud to be used by one or more particular customers or client computing devices 340 and/or over a private network. Public clouds or hybrid public-private clouds may be used by other customers over open or hybrid networks. Known cloud systems may alternatively be used, e.g., MICROSOFT AZURE (Microsoft Corporation of Redmond, Wash.), AMAZON EC2 (Amazon.com Inc. of Seattle, Wash.), GOOGLE COMPUTE ENGINE (Google Inc. of Mountain View, Calif.), or others.

The spatially-optimized simulation development environment 300 may be deployed as a Platform-as-a-Service (PaaS) cloud-based computing service which may provide a platform for allowing a user to develop, run, and manage a spatially-optimized simulation. This may allow a user or client to create a spatially-optimized simulation without understanding the intricacies of distributed computation or requiring access to infrastructure teams or supercomputers. The spatially-optimized simulation development environment 300 may be delivered as a public cloud service from a provider. In such a scenario, client organizations may provide pre-existing models, simulations, and/or databases which may be integrated with the spatially-optimized simulation development environment 300. Alternatively, the spatially-optimized simulation development environment may be delivered as a private service within a private network of a client organization.

The cloud-based computing platform 310 may comprise one or more virtual servers 202*a*-202*f* (generally 202) such as the virtual server 202 illustrated in FIG. 2. Optionally, the cloud-based computing platform 310 may comprise special-purpose virtual and/or physical computing resources which may be configured to provide spatially-optimized simulation functionality as described herein. Although FIG. 3 illustrates six virtual servers 202 (i.e., 202*a*-202*f*), those of skill in the art will appreciate that cloud-based computing platform 310 may comprise any number of virtual servers 202. The virtual servers 202 may be interconnected via one or more networks in a manner that may allow each virtual server 202 to communicate directly with any other virtual server 202 in the cloud-based computing platform 310 in a peer-to-peer fashion. Optionally, virtual servers 202 may be arranged into a plurality of clusters of virtual servers. For example, clusters of virtual servers may be arranged based on a physical location of the physical computing resources used by the cloud-based computing platform 310. In such an example, one cluster may be a first cloud datacenter located in California, and another cluster may be a second cloud datacenter located in Ireland (these are merely illustrative locations). In another example, clusters of virtual servers may be arranged based on an allocation to a spatially-optimized simulation. In such a scenario, one cluster may be comprised by a first subset of virtual servers 202 allocated to a first spatially-optimized simulation and another cluster may be a second subset of virtual servers 202 allocated to a second spatially-optimized simulation. A virtual server 202 may be manually or dynamically reassigned to a different cluster if or when the virtual server 202 is moved or if or when the computing resource requirements for the first spatially-optimized simulation and the second spatially-optimized simulation may change over time. Client computing devices 340 connecting to a virtual server 202 may be unaware of which cluster, if any, the virtual server 202 belongs to and may also be unaware whether the virtual server 202 may change membership from one cluster to another during the course of the connection.

The cloud-based computing platform system 300 may also comprise a cloud-based data store 320. The storage resources in the cloud-based data store 320 may include storage disks (e.g., solid state drives (SSDs), magnetic hard disks, etc.) and other storage devices. Alternatively, the cloud-based data store 320 may be provided by a known cloud-based storage provider, such as, AMAZON S3 (Amazon.com Inc. of Seattle, Wash.), GOOGLE CLOUD STORAGE (Google Inc. of Mountain View, Calif.), or others.

Optionally, the cloud-based data store 320 may be implemented or deployed separately from cloud-based computing platform 310 as shown in FIG. 3. Optionally, the cloud-based data store 320 may be implemented or deployed within the cloud-based computing platform 310. For example, both the cloud-based computing platform 310 and the cloud-based data store 320 may be provided by a cloud systems provider as part of the resources assigned to the cloud system by the provider.

The cloud-based data store 320 may comprise one or more application assemblies 322. An application assembly 322 may comprise data which may define entities and components of a spatially-optimized simulation, as well as, procedures which may define one or more behaviors of each of the entities and components in a spatially-optimized simulation. Optionally, an application assembly 322 may comprise schemas, data structures, serialized objects, and the like which may define the entities and components which make up a spatially-optimized simulation. Optionally, an application assembly 322 may comprise computer-readable code or instructions, scripts, statically-linked libraries, dynamically-linked libraries, and the like which may define one or more behaviors for the elements in the spatially-optimized simulation. Virtual servers 202 in the cloud-based computing platform 310 may load an application assembly from the cloud-based data store 320. The spatial simulation runtime 248 in each virtual server 202 may use the data and procedures comprised in an application assembly 322 to cause the execution of a distributed, persistent, and spatially-optimized simulation. The cloud-based data store 320 may also comprise initialization data and/or procedures 324 which define a starting or initial condition for a spatially-optimized simulation. For example, the cloud-based computing platform 310 may load initialization data 324 from the cloud-based data store 320 which may cause a predetermined number of entities and components to be instantiated and initialized to a predetermined initial state. In another example, the cloud-based computing platform 310 may load and may execute one or more initialization procedures 324 which may cause a predetermined number of entities and components to be instantiated and initialized to a predetermined state. In yet another example, the entities and the components may be instantiated and initialized to a predetermined state based on a combination of initialization data 324 and initialization procedures 324 loaded by the cloud-based computing platform 310 from the cloud-based data store 320.

The cloud-based data store 320 may comprise a snapshot 326 of a simulation. A simulation snapshot 326 may define a valid state of a simulation, and may comprise data and/or procedures which may return a spatially-optimized simulation to that valid state if or when it is loaded and/or executed by the cloud-based computing platform 310 from the cloud-based data store 320. The valid simulation state defined by snapshot 326 may be a known state or a desired state of the simulation. Optionally, the simulation state defined by snapshot 326 may be a previously saved state of a running simulation.

A portion of the cloud-based computing platform 310 may be related, for example, one or more virtual servers 202 may be executing a spatially-optimized simulation on behalf of the same end user, or on behalf of different users affiliated with the same company or organization. In other examples, certain virtual servers 202 may be unrelated, such as users affiliated with different companies or organizations. For unrelated clients, information on the virtual servers 202 or cloud-based data store 320 of any one user may be hidden from other users.

In some instances, client computing devices 340 may implement, incorporate, and/or otherwise include one or more aspects of computing device 101 and computing device 202. Client computing devices 340 may be any type of computing device capable of receiving and processing input via one or more user interfaces, providing output via one or more user interfaces and communicating input, output, and/or other information to and/or from one or more other computing devices. For example, client computing devices 340 may be desktop computers, laptop computers, tablet computers, smart phones, or the like. In addition, and as illustrated in greater detail below, any and/or all of client computing devices 340 may, in some instances, be special-purpose computing devices configured to perform specific functions.

The client computing devices 340 may comprise a worker integration library 342 and an instance of a worker process 249. A client computing device 340 may utilize the worker integration library 342 and the worker process 249 to connect to a spatially-optimized simulation executing in the cloud-based computing platform 310. As described in further detail below, a client computing device 340 may receive data from the cloud-based computing platform 310 describing relevant portions of the spatially-optimized simulation. The worker process 249 executing in the client computing device 340 may utilize that received data to render the relevant portions of the spatially-optimized simulation on a display or other user interface device. The client computing device 340 may also transmit data and commands to cloud-based computing platform 310 which may affect the state of the spatially-optimized simulation. The data and commands may be transmitted in response to user input. Optionally, the transmitted data and commands may be generated in response to calculations performed by the worker integration library 342 or the worker process 249.

Advantageously, and as illustrated in greater detail above, a simulation developer using a spatially-optimized simulation development environment may be able to scale up a game or simulation to be considerably larger than would be possible using a single machine. In addition, the spatially-optimized simulation development environment may allow for an arbitrary number of user participants and data sources to integrate into the simulation. Furthermore, the spatially-optimized simulation development environment may remove the need for a simulation developer to worry about scalability or data synchronization among different parts of the spatially-optimized simulation.

FIG. 3 illustrates just one example of a spatially-optimized simulation development environment that may be used, and those of skill in the art will appreciate that the specific system architecture and computing devices used may vary, and are secondary to the functionality that they provide, as further described herein.

Figure 4:
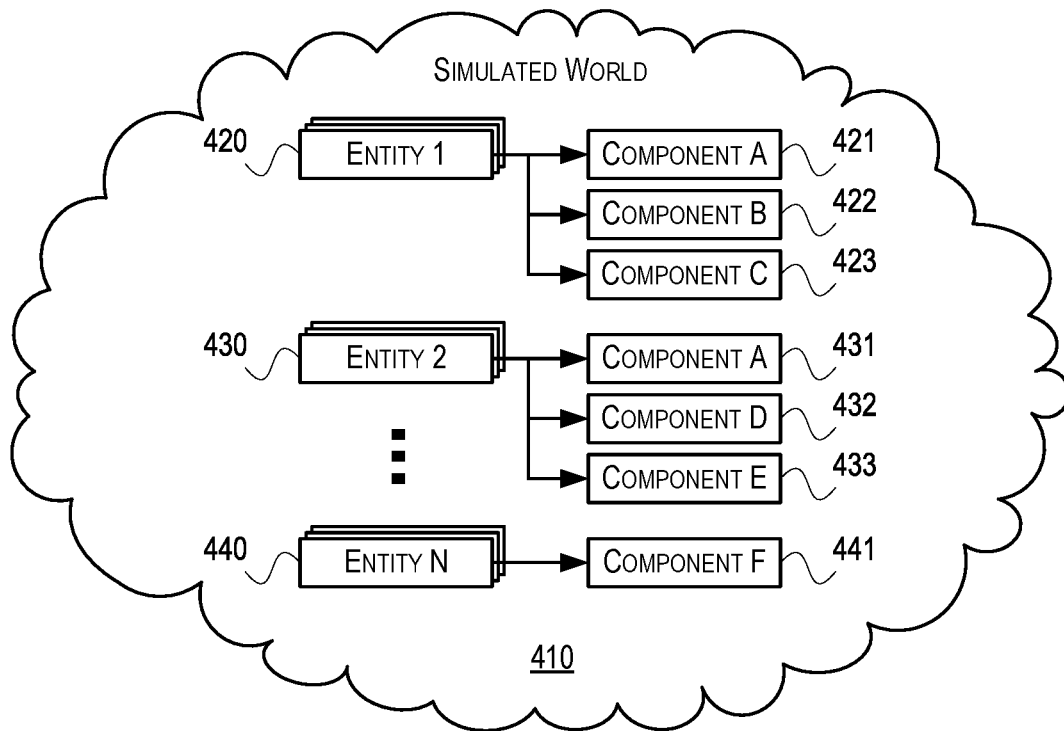
FIG. 4 depicts an illustrative entity architecture that may be used in accordance with one or more illustrative aspects described herein.

FIG. 4 illustrates one example of a block diagram of a spatially-optimized simulation that may be implemented according to one or more illustrative examples of the disclosure. A spatially-optimized simulated world 410 may comprise a collection of entities (e.g., entity 1 420, entity 2 430, and entity N 430.) An entity may represent a fundamental computational unit or other unit of simulated world 410. While FIG. 4 illustrates a simulated world 410 comprising three entity types, in other examples, a simulated world 410 may comprise any number of entity types. Additionally, simulated world 410 may comprise any number of instances of each entity type. For example, in a city simulation, simulated world 410 may comprise a car entity, a pedestrian entity, a traffic signal entity, a road entity, a building entity, and the like. In such a scenario, the city simulation may comprise large and different quantities of instances of each entity. In another example, in a video game world simulation, simulated world 410 may comprise a monster entity, a player entity, a weapon entity, a tree entity, a rock entity, and the like. The video game simulated world may comprise a handful of instances of the monster entity, one player entity instance for each player active in the game, and potentially millions of instances of the tree and rock entities. In yet another example, in a trading simulation, simulated world 410 may comprise a trader entity, a stock entity, a mutual fund entity, a market agent entity, and the like. The simulated trading world may comprise small numbers of trader and market agent entities and may also comprise thousands of stock and mutual fund entities.

The state and behavior of an entity (e.g., 420, 430, and 440) may be determined by the combination of components (e.g., 421, 422, 423, 431, 432, 433, and 441) comprised by the entity. Each component (e.g., 421, 422, 423, 431, 432, 433, and 441) may comprise a subset of the state and behavior attributed to the entity (e.g., 420, 430, and 440) as a whole. For example, as shown in FIG. 4, entity 1 420 may comprise component A 421, component B 422, and component C 423; entity 2 430 may comprise component A 431, component D 432, and component E 433; and entity N 440 may comprise component F 441. As will be appreciated by one of skill in the art, the number and types of components comprised by any one entity may be arbitrary and not limited to the example illustrated in FIG. 4. Optionally, two or more entities may comprise different instances of a particular component if or when the two or more entities have a set of properties and behaviors in common. For example, entity 1 420 may represent a rock in a video game simulation and entity 2 430 may represent a monster in the same simulation. Both entities (i.e., 420 and 430) may share a component A (e.g., 421 and 431) which may define the properties and behaviors for a rigid body, i.e., mass and velocity.

Entities (e.g., 420, 430, and 440) may comprise properties which may be common across all entities. For example, entities (e.g., 420, 430, and 440) may comprise an identifier value which may be used to uniquely identify each entity instance within simulated world 410. Entities (e.g., 420, 430, and 440) may comprise properties which may be shared across multiple components. For example, entities (e.g., 420, 430, and 440) in a video game simulation may comprise position and velocity values since it is likely that most components in such a simulation may require access to those values. Additionally, locating commonly used properties within an entity may reduce coupling between the components and facilitate communication between the components of an entity.

Figure 5:
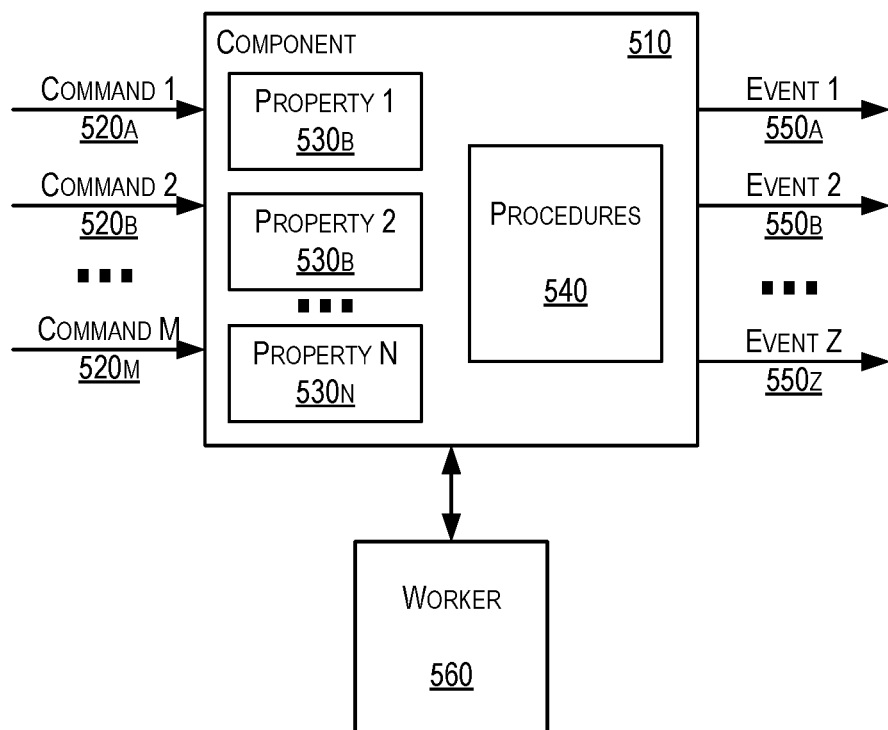
FIG. 5 depicts an illustrative component architecture that may be used in accordance with one or more illustrative aspects described herein.

Referring to FIG. 5, some aspects described herein may be implemented, incorporated, and/or otherwise included by one or more components 421, 422, 423, 431, 432, 433, and 441. FIG. 5 illustrates an example implementation of a component 510 in a spatially-optimized simulation system as described herein. A component 510 may comprise a collection of related persistent properties 530*a*-530*n* (generally 530) and events 550*a*-550*z* (generally 550.) The component 510 may also comprise procedures 540 which may change the value of the component's properties and may generate events. Procedures 540 may execute, as part of a server worker 249*a*-249*n*, in a server such as one of the servers illustrated in FIGS. 2-3 (e.g., 240*a*-240*n*, 202*a*-202*f*, and 340*a*-340*n*.) A spatial simulation runtime 248 or other software entity may delegate the write authority of the properties and event generation from the component 510 to a specialized worker 560. The spatial simulation runtime 248 or other software entity may re-delegate or handover write authority from one specialized worker 560 to another specialized worker. Other components and/or workers executing within a spatially-optimized simulation may cause or trigger updates in the state of component 510 via commands 520*a*-520*m* (generally 520.) Alternatively, no delegation may take place.

Components may comprise one or more properties 530. The state of a component 510 may be defined by the values held by the properties 530 comprised by the component 510. Similarly, the state of an entity may be defined by the values held by the properties 530 of all the components comprised by the entity. The state of a component 510 may be stored in local memory (e.g., 242*a*-242*n*, 244*a*-244*n*, 218) for access during execution of the spatially-optimized simulation. Optionally, the state of a component 510 may be stored in cloud-based data store 320 as part of a snapshot 326 and thus may be persisted across simulation runs. The state of a component 510 may be stored periodically (e.g., continuously.) The rate at which the state of a component 510 is persisted may vary based on one or more factors. For example, if or when the state of a component 510 changes rapidly, the storage rate may also increase commensurate with the rate of change. In another example, the storage rate may be higher for properties which may require a higher degree of accuracy than other properties.

Where it is described that an entity or component may exhibit a certain behavior, it is to be understood that another element, such as a worker module, for example, may perform the required calculations on behalf of that entity or component and emit or receive the corresponding signals or data.

Events 550 may indicate the occurrence of a transient action on component 510. Component 510 may emit one or more events 550 in response to making a determination (or events 550 may be emitted for one or more components 510), reaching a particular result, receiving user input, or another type of trigger. Other components within the spatially-optimized simulation may monitor the occurrence of an event 550 and update their state or perform an action in response to the event 550. The other components may be comprised by the same entity (e.g., a worker module) as the emitting component or may be comprised by other entities within the spatially-optimized simulation. For example, a traffic signal entity in a city simulation may emit an event if or when the traffic signal indicator changes to red. A vehicle entity in the city emulation may receive the event and may come to a stop in response to the event. In another example, a rigid body component may emit an event if or when it has determined that it has collided with another object.

Optionally, component 510 may comprise procedures 540 which may update the values of properties 530, as well as, cause the component 510 to emit events 550. Procedures 540 may also receive and process commands 520 from other components and/or the spatial simulation runtime 248. Thus, procedures 540 may define the behavior of component 510 within the spatially-optimized simulation. Alternatively, a spatial simulation runtime 248 may delegate to a specialized worker 560 the implementation of the behavior of component 510. In such a scenario, spatial simulation runtime 248 may delegate write access of properties 530 and events 550 from component 510 to specialized worker 560. Component 510 may have at most one writer assigned to it at any one time. Thus, a spatial simulation runtime 248 may remove the ability of procedures 540 to modify properties 530 and emit events 550 until delegation to specialized worker 560 is revoked. Optionally, a specialized worker 560 may implement the behavior of a component based on real-time and/or real-world behavior of a physical entity being simulated. For example, a specialized worker 560 may periodically collect position, velocity, and direction data from one or more sensors mounted on a vehicle or other moving object and use that information to modify properties 530 and emit events 550 of component 510. In another example, a specialized worker 560 may receive previously recorded real-world position, velocity, and direction data of a vehicle or other moving object and use that information to modify properties 530 and emit events 550 of component 510. Thus, a specialized worker 560 may be used to incorporate real-time and/or real-world into the spatial simulation. Any other real world objects, people, events, and/or systems may be used to generate data as input for a simulation.

Delegation may require specification of a worker constraint which may identify a type of worker capable of simulating the behavior of component 510. Worker 560 may be one of a plurality of worker types which may be specialized to perform certain kinds of computations. Specialized workers 560 may only understand a subset of the components (e.g., 421, 422, 423, 431, 432, 433, and 441) that define entities (e.g., 420, 430, and 440) within a spatially-optimized simulation 410. For example, in a city simulation, one worker type may simulate vehicle positions, another worker type may simulate traffic signals, and yet another type may simulate environmental emissions.

Worker 560 may comprise data structures and/or objects and software programs to simulate the behavior of a subset of the components (e.g., 421, 422, 423, 431, 432, 433, and 441) within a spatially-optimized simulation 410. Worker 560 may be a process corresponding to one or more aspects of workers 249, as described in FIGS. 2 & 3. Thus, worker 560 may execute, as part of a server worker 249a-249n, in a server such as one of the servers illustrated in FIGS. 2-3 (e.g., 240a-240n, 202a-202f, and 340a-340n.) Worker 560 may read the properties 530 of any component (e.g., 421, 422, 423, 431, 432, 433, and 441) in spatially-optimized simulation 410. However, worker 560 may only write the properties 530 of those components (e.g., 421, 422, 423, 431, 432, 433, and 441) that have delegated their write authority to worker 560. A worker 560 may be said to be authoritative for a component 510 if or when component 510 has delegated its write authority to worker 560. Worker 560 may be authoritative to a subset of entities (e.g., 420, 430, and 440) within a spatially-optimized simulation 410. Optionally, worker 560 may be authoritative to one or more entities which may be located close to each other within spatially-optimized simulation 410. In some aspects, write authority may change from one worker 560 to another worker, such as during a write authority handover. For example, a distributed algorithm for optimistic, time-based authority change may be utilized in one or more of the simulation systems described herein. As will be described in further detail below, the handover of write authority may comprise a plurality of states (e.g., three states) and may occur over a period of time.

In order to simulate the behavior of a component (e.g., 421, 422, 423, 431, 432, 433, and 441), worker 560 may need information (e.g., properties, events) from nearby entities (e.g., 420, 430, and 440) within spatially-optimized simulation 410. For example, a worker simulating a traffic intersection in a city simulation may need information from vehicles in nearby intersections, but not from vehicles which are miles away from the intersection. The interest region for worker 560 may comprise all regions comprising nearby entities (e.g., 420, 430, and 440) from which the worker 560 needs information. The interest region for worker 560 may comprise entities (e.g., 420, 430, and 440) for which worker 560 is not authoritative. The spatially-optimized simulation 410 may automatically synchronize the data between worker 560 and the other workers which are authoritative for the nearby entities.

Figure 6:
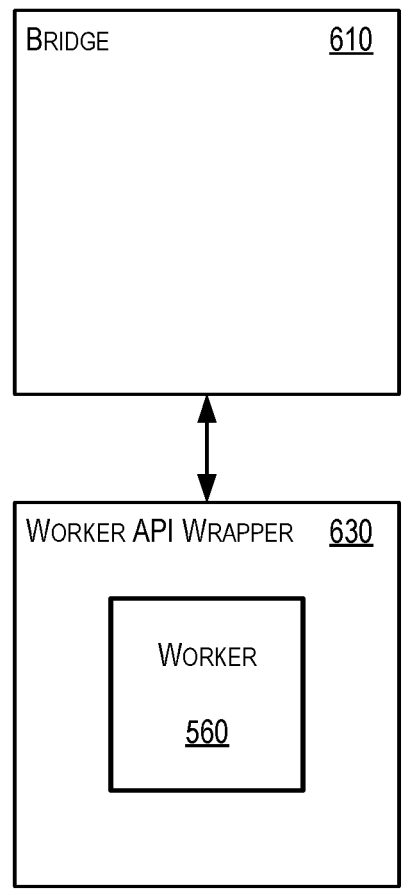
FIG. 6 depicts an illustrative worker architecture that may be used in accordance with one or more illustrative aspects described herein.

Worker 560 may communicate with the spatially-optimized simulation 410 (e.g. with entities) via a bridge 610, as illustrated in FIG. 6. FIG. 6 illustrates an example implementation of a worker 560 communicating with a bridge 610 in a spatially-optimized simulation 410 as described herein. A bridge 610 may be responsible for communicating relevant information (e.g., properties, events) from worker 560 to other interested workers within a spatially-optimized simulation 410. Bridge 610 may also be responsible for communicating relevant information from nearby entities within the interest region for worker 560. Bridge 610 may be assigned to only one worker 560 and worker 560 may communicate with only one bridge 610. That is, there may be a one-to-one relationship between bridge 610 and worker 560. Bridge 610 may execute, as part of a server worker 249a-249n, in a server such as one of the servers illustrated in FIGS. 2-3 (e.g., 240a-240n, 202a-202f, and 340a-340n.)

Communication between bridge 610 and worker 560 may be effectuated via a worker application programming interface (API). Optionally, worker 560 may be wrapped by worker API wrapper 630. Worker API wrapper may allow a worker 560 which may have been developed independently from the spatially-optimized simulation development environment to possibly function within and by managed by bridge 610. Optionally, the worker API may allow for the integration of pre-existing non-distributed simulation programs into a large-scale distributed spatially-optimized simulation. For example, a game engine (e.g., UNITY by Unity Technologies SF of San Francisco, Calif.) may be integrated into a spatially-optimized simulation to simulate rigid-body physics or to provide client-side rendering and navigation. In another example, a multi-modal traffic flow simulation software package (e.g., open source MATSIM, or other commercially available software packages) may be integrated into a city spatially-optimized simulation. Other worker engines or programs may alternatively or also be used.

In another example implementation, specialized worker 560 may require special-purpose hardware or other physical resources that might not be available within a cloud-based platform 310. In such a scenario, the worker API wrapper 640 and bridge 610 may reside on a computing device physically located remotely from the cloud-based platform 310 and may connect to the cloud-based platform 310 via the Internet or another type of network. Such a specialized worker 560, which may reside outside of the cloud-based platform 310, (e.g., may execute on client devices 340a-340n) may be referred to as an external worker. And another specialized worker 560, which may execute within the cloud-based platform 310, (e.g., may execute on servers 240a-240n, 202a-202f) may be referred to as an internal worker. Any one or more of the features described with reference to the cloud-based platform 310 may be used in or with this example implementation.

The worker API may allow a bridge to add or remove entities from the interest region of a worker, notify a worker of component state changes, delegate a component to a worker or to remove the delegation, signal component state changes for components on which the worker is authoritative, among other related functionality as described herein.

Among the functions provided by the worker API may be functions for adding or removing an entity. Optionally, worker API wrapper 630 may comprise a handler method to be called by bridge 610 when an entity enters the interest region of worker 560. For example, Method 1 is one example of a method signature that may be used to add an entity to the interest region of worker 560.

Method 1:
void OnEntityAdd(EntityId eid, EntityState initialState); where
eid is a value which may uniquely identify the entity being added; and
initialState is a data structure and/or object which may describe the initial state of the entity being added.

Although Method 1 is provided as an example for adding an entity to the interest region of worker 560, various other methods and/or functions may be used. For instance, other parameters may be included in the method without departing from the disclosure. Method 1 may then be passed to a RegisterEntityAddHandler( ) worker API function, which may cause the Method 1 handler to be called whenever an entity should be added.

Optionally, worker API wrapper 630 may comprise a handler method to be called by bridge 610 when an entity leaves the interest region of worker 560. For example, Method 2 is one example of a method signature that may be used to remove an entity from the interest region of worker 560.

Method 2:
void OnEntityRemove(EntityId eid); where
eid is a value which may uniquely identify the entity being removed.

Although Method 2 is provided as an example for removing an entity from the interest region of worker 560, various other methods and/or functions may be used. For instance, other parameters may be included in the method without departing from the disclosure. Method 2 may then be passed to a RegisterEntityRemoveHandler( ) worker API function, which may cause the Method 2 handler to be called whenever an entity should be removed.

The worker API may also comprise functions for notifying a worker that the properties of a component within the worker's interest region have changed state. For example, worker API wrapper 630 may comprise a handler method to be called by bridge 610 when the properties of a component within the interest region of worker 560 have changed state. Method 3 is one example of a method signature that may be used to notify worker 560 of the changed state.

Method 3:
void OnStateChanged_Component1(EntityId eid, SomeState state); where
eid is a value which may uniquely identify the entity which may comprise the component whose properties changed state; and
state is a data structure and/or object which may describe the state of the component.

Although Method 3 is provided as an example for notifying worker 560 of a changed state, various other methods and/or functions may be used. For instance, other parameters may be included in the method without departing from the disclosure. In some variants, the state parameter may comprise only the subset of properties of the component that have changed since the last update, for efficiency. Method 3 may then be passed to a AddComponentStateChangeHandler( ) worker API function, which may cause the Method 3 handler to be called whenever the properties of a component within the worker's interest region have changed state.

Among the functions provided by the worker API may be functions for dynamically changing component authority assignments. Worker API wrapper 630 may comprise a handler method to be called by bridge 610 when worker 560 may now be authoritative for a component. For example, Method 4 is one example of a method signature that may be used to delegate component authority to worker 560.

Method 4:
void OnComponentDelegate(EntityId eid, ComponentId cid); where
eid is a value which may uniquely identify the entity which may comprise the component being delegated; and
cid is a value which may uniquely identify the component being delegated.

Although Method 4 is provided as an example for delegating component authority to worker 560, various other methods and/or functions may be used. For instance, other parameters may be included in the method without departing from the disclosure. Method 4 may then be passed to a RegisterComponentDelegateHandler( ) worker API function, which may cause the Method 4 handler to be called whenever worker 560 may now be authoritative for a component.

Optionally, worker API wrapper 630 may comprise a handler method to be called by bridge 610 when worker 560 may no longer be authoritative for a component. For example, Method 5 is one example of a method signature that may be used to remove delegation authority for a component from worker 560.

Method 5:
void OnComponentUndelegate(EntityId eid, ComponentId cid); where
eid is a value which may uniquely identify the entity which may comprise the component being undelegated; and
cid is a value which may uniquely identify the component being undelegated.

Although Method 5 is provided as an example for removing delegation authority for a component from worker 560, various other methods and/or functions may be used. For instance, other parameters may be included in the method without departing from the disclosure. Method 5 may then be passed to a RegisterComponentUndelegateHandler( ) worker API function, which may cause the Method 5 handler to be called whenever worker 560 may no longer be authoritative for a component.

In yet other examples, worker API wrapper 630 may comprise a handler method to be called by bridge 610 for setting or unsetting a worker 560 as authoritative for a component. For example, the handler method may implement a load balancer to determine which worker is tasked with simulating which entity component. Each component of an entity may be simulated by a particular type of worker, and the load balancer may choose which particular instance of a given worker type is to simulate the given component(s). For example, Method 6 is one example of a method signature that may be used to set or remove delegation authority for a component for worker 560.

Method 6:
void SetIsAuthoritative(EntityId eid, ComponentId cid, Boolean isAuthoritative); where
eid may be a value which may uniquely identify the entity, which may comprise the component;
cid may be a value which may uniquely identify the component; and isAuthoritative may be a true/false value which may indicate whether to set or unset worker 560 as authoritative for a component.

Although Method 6 is provided as an example for setting or unsetting a worker 560 as authoritative for a component, various other methods and/or functions may be used. For instance, other parameters may be included in the method without departing from the disclosure.

In some aspects, a worker may have a large number of internal states that may be updated frequently. However, the updates might only be communicated (e.g., broadcast) to other nodes infrequently. For example, a worker might be responsible for planning the actions a particular component takes. The amount of data involved for this state might be large, e.g., it might include some amount of history of things that the component has seen. If a new worker takes over write authority for controlling the component, the new worker may want to have an up to date view of this state. However, if the previous (e.g., incumbent) worker sends a full state update to the simulation runtime (e.g., special simulation runtime 248) each time the component state changes, a significant amount of network traffic and CPU resources may be consumed.

In order to address these technical challenges, a soft handover may be used. Workers may be able to receive a callback before the worker loses authority over any component (e.g., as a best effort). After the callback, the worker may be able to send component updates. Once the worker has finished persisting its final component states, the worker may be able to notify the runtime that it is ready to lose authority. Other workers might not be authoritative on the component while it is in the transition phase. The transition phase may be provided on a best effort. If a worker stops responding, the runtime may force an authority change within a constant-bounded time.

Write authority may be reflected in a map that maps components of entities to worker identifiers. In some aspects, a handler method may use more than two values (e.g., three values) for transitioning authority over a component from one worker to another worker, rather than a Boolean value. Method A is one example of a method signature that may be used to set, notify of, or remove authority for a component for worker 560.

Method A:

void SetIsAuthoritative(EntityId eid, ComponentId cid, authority); where eid may be a value which may uniquely identify the entity which may comprise the component;

cid may be a value which may uniquely identify the component; and authority may be a value that indicates whether to set a worker as authoritative for a component, unset a worker as authoritative for the component, or notify a worker of an imminent loss of authority over the component. authority may be, for example, an enumerated type (enum) with the three states.

Although Method A is provided as an example for setting or unsetting a worker 560 as authoritative for a component or notifying a worker 560 of an imminent loss of authority over the component, various other methods and/or functions may be used. Other parameters or values may be included in the method without departing from the disclosure. For example, authority may be a value that indicates to a new worker that the new worker is gaining authority over one or more components in the future (e.g., after a transition period or after the incumbent worker notifies the runtime 248 that the incumbent worker is ready to lose authority).

Figure 12:
FIG. 12 depicts exemplary state transitions for workers in accordance with one or more illustrative aspects described herein.

FIG. 12 depicts exemplary state transitions for workers. For example, the state of a particular worker 560 may be authoritative during a first time period, which may be indicated by the authority state AUTHORITATIVE 1210. During a second time period (e.g., a transition period), the state of the worker 560 may change from authoritative to authority lost imminent, which may be indicated by the authority state AUTHORITY_LOST_IMMINENT 1215. The duration of the transition period may be, for example, 100 milliseconds. During a third time period, the state of the worker 560 may change from authority lost imminent to not authoritative, which may be indicated by the authority state NOT_AUTHORITATIVE 1205. At a later time, the state of the worker 560 may change back to authoritative 1210 for a particular component, and so on. As will be discussed in further detail below, a computing device implementing a runtime (e.g., the spatial simulation runtime 248) may manage the authority state of each worker and may notify each worker of its authority state.

To allow a worker to release authority prematurely when the worker is in the AUTHORITY_LOST_IMMINENT state 1215 (e.g., before the end of the transition period), a method B may be used.

Method B:

void SendAuthorityLossAck<C>(EntityId entityId) where C: IComponentMetaclass

This method may be called on entities which are currently in the AUTHORITY_LOSS_IMMINENT state, according to the worker SDK.

A configuration parameter, which may be exposed to users, may define the amount of time between the runtime notifying the worker that it is losing authority to the runtime notifying the worker that it has lost authority. There may be a few different options for specifying this, such as per deployment, per worker, per component type, or per entity-component. In some aspects, soft-handover may depend on the component type of the component and the parameter may be configured per component type. Moreover, components may be configured to utilize two states (e.g., an authoritative state or a not authoritative state), three states (e.g., an authoritative state, a not authoritative state, or an authority lost imminent state), or four states (e.g., an authoritative state, a not authoritative state, an authority lost imminent state, or a gaining authority state). That is, soft handover may be disabled for one or more components. A value of 0 may disable soft handover for a component, and the worker may receive both an AUTHORITY_LOSS_IMMINENT and a NOT_AUTHORITATIVE callback. The duration may default to 0. For example, a component that indicates a position of an entity may utilize two states. A component that has a very small amount of transient state (and which may be easy to wrap up and move elsewhere) may utilize two states (e.g., authoritative and not authoritative). For example, cellular automata, which may have no private state per cell, may utilize two states. As another example, flocking algorithms, which may have no private state and may have very minimal data to hand off to another worker, may utilize two states.

Other components may utilize three states. A component may utilize the authoritative state, the not authoritative state, and the authority lost imminent state. For example, an AI state within a character within a world (e.g., a game world) may utilize these three states. There may be a representation of its AI behavior tree that you might not want to always synchronize and may want to synchronize only when necessary. There may be a lot of large data that the system does not always want to send. The worker may desire to wrap up its work before sending to another worker, which may be a private state that is moved to the other worker. In some aspects, a component may utilize the authoritative state, the not authoritative state, and the gaining authority state. For example, components in a physics simulation within a world may utilize these three states. In this example, a component may regularly synchronize with a high fidelity representation of its state, so the authority lost imminent state might not be used. However, the gaining authority state may be useful because pulling in the necessary physical data and meshes when a worker becomes authoritative may be time consuming. Yet other components may utilize four states (or more).

Figure 13:
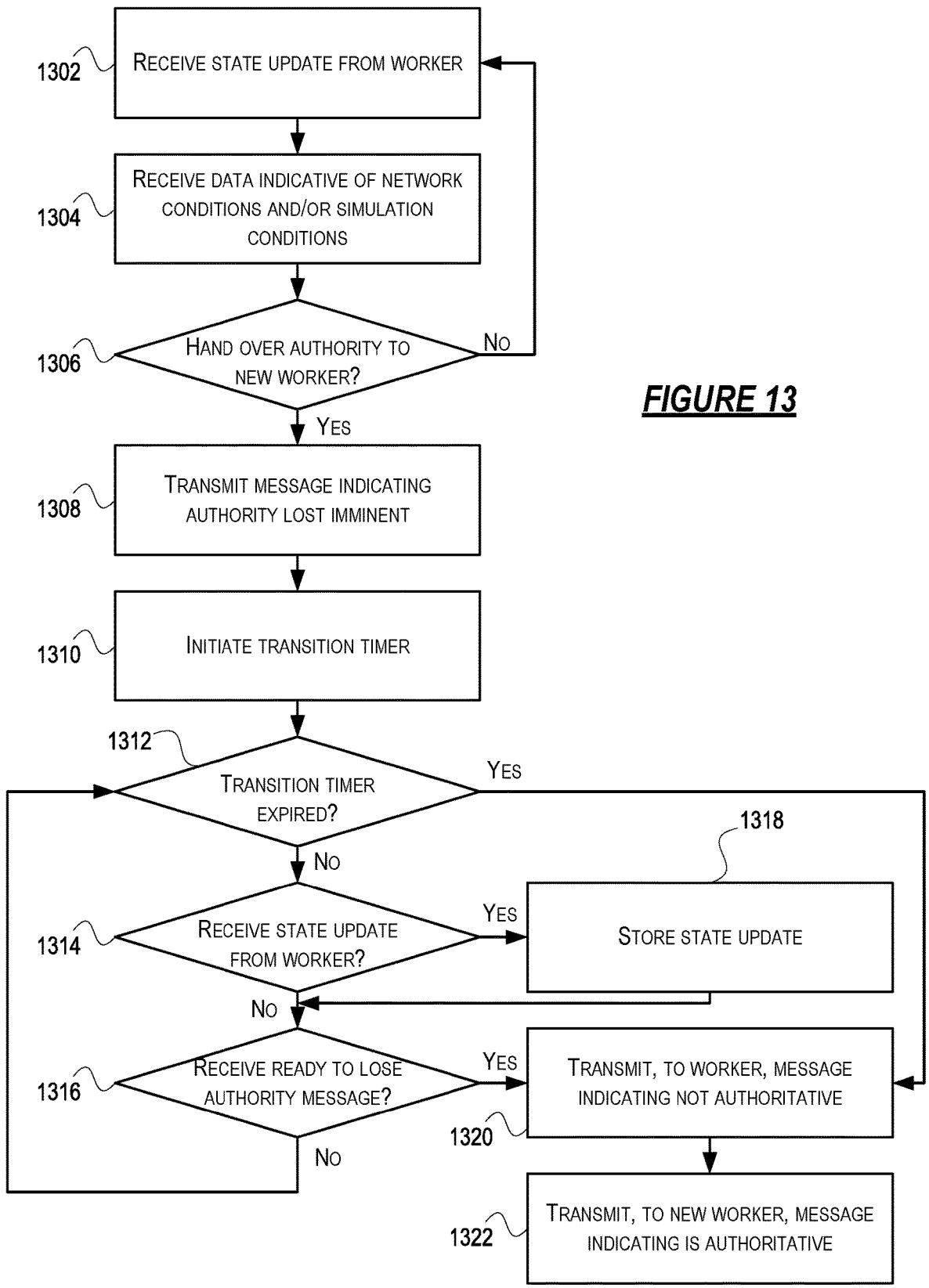
FIG. 13 depicts a flowchart that illustrates a method of handing over authority over one or more components from one worker process to another worker process within a spatially-optimized simulation in accordance with one or more illustrative aspects described herein.

FIG. 13 depicts a flowchart that illustrates a method of handing over authority over one or more components from one worker process to another worker process within a spatially-optimized simulation. The algorithm shown in FIG. 13 and other similar examples described herein may be performed in a computing environment such as the system illustrated in FIGS. 3-6, as well as other systems having different architectures (e.g., all or part of FIGS. 1-2.) The method illustrated in FIG. 13 and/or one or more steps thereof may be embodied in a computer-readable medium, such as a non-transitory computer readable memory.

As previously described, a spatial simulation runtime 248 may delegate, to a worker process (e.g., worker 560), the implementation of the behavior of a component (e.g., component 510). After implementation of the component 510 is delegated to the worker 560, the worker 560, during the simulation, may, for example, write to properties of the component 510, communicate with the component 510 to implement an action by the component 510, cause events to be output by the component 510, etc. During implementation of the behavior of the component 510 (or other components delegated to the worker 560), the worker 560 may transmit, to the simulation runtime 248, updates to one or more states of the component 510. The transmission may occur, for example, infrequently, periodically, and/or in response to an update to the state of the component 510. As previously described, the worker 560 may communicate with the simulation runtime 248 via a bridge (e.g., bridge 610). As will be described in further detail below, workers may save their state periodically because a message from the runtime 248 indicating that the worker is about to lose authority might not arrive at the worker or be processed by the worker in time for the worker to react.

Referring to FIG. 13, in step 1302, the spatial simulation runtime 248 may receive, from the worker 560, state updates to a component 510. The runtime 248 may receive the state update from the worker 560 via the bridge 610. The runtime 248 may communicate the state update or information related to the state update to other interested workers in the simulation 410. The runtime 248 may store the state update or information related thereto.

In step 1304, the simulation runtime 248 may receive data indicative of network conditions and/or simulation conditions. In step 1306, the simulation runtime 248 may determine whether to hand over authority over one or more components, such as component 510, from the worker 560 to a new worker. Various triggers for a handover may exist. For example, an entity moving across a world and entering the authoritative area of another worker may trigger a handover. A worker crashing and a new worker taking over the work of the crashed worker may trigger a handover. A new worker starting and taking over parts of a world may trigger a handover. A worker becoming under load and shedding its furthest areas of work may trigger a handover.

If the runtime 248 determines not to hand over authority to a new worker (step 1306: no), the method may return to step 1302 to receive additional state updates from the worker 560. If, on the other hand, the runtime 248 determines to hand over authority to a new worker (step 1306: yes), the method may proceed to step 1308. The runtime 248 may identify the new worker based on a load balancing algorithm, as previously described and will be described in further detail below. The load balancing algorithm may notify the bridge of the new worker that the new worker is or will be authoritative.

In step 1308, the runtime 248 may transmit, to the worker 560 (e.g., via the bridge 610), a message (e.g., an operation or op) indicating that the worker 560 will lose authority over the component at a future time, such as shortly. The message may identify the component (e.g., component 510) and/or the time at which authority will be handed over to a new worker. The amount of time (e.g., a transition time) may be configurable by a user. For example, even if the worker 560 does not receive, acknowledge, and/or act on the message transmitted to it in step 1308, the runtime 248 might still handover control of the component to a new worker at the end of the transition time. This may be beneficial if the worker 560 is overloaded and acting on other messages or other processes and is unable to react to the message from the runtime 248.

During the transition period after runtime 248 transmits the authority lost imminent message, the worker 560 that is losing authority may save and/or update final component states and transmit the final state to the runtime 248. The worker 560 may also transmit, to the runtime 248, a message indicating that the worker 560 is ready to relinquish authority prior to the end of the transition period, and the runtime 248 may preemptively handover authority to the new worker. If the worker 560 receives, during the transition period, commands to be performed on or by the component, the worker 560 may buffer or otherwise store the commands, which may be implemented by the new worker once handover is complete. By buffering the commands, commands and/or other data may be saved, even during a handover scenario. Other examples of actions taken by the worker 560 during the transition period will be described in further detail below, such as with reference to FIG. 14.

Returning to FIG. 13, in step 1310, the runtime 248 may initiate a timer for the transition period. The timer may be used to track the length of time of the transition period from the worker 560 to the new worker (e.g., the amount of time that the worker 560 spends in the authority lost imminent state). The length of time of the transition period may be configurable. As an example, the transition period may be 100 milliseconds. As another example, a physics engine may be updating at 60 Hz (e.g., 16 milliseconds per frame, with approximately 0.5 millisecond round trip from the worker process to the bridge), which would be two frames of simulation. In this example, the transition period may be 32 milliseconds, which may give it enough time to buffer the request, receive the message, and then process the frame to hand off the information. As yet another example, the transition period may be 1000 milliseconds. 1000 milliseconds may be used for, for example, an inventory system to finish committing any transactions it has in flight to an external database, which might not be part of the simulation.

In step 1312, the runtime 248 may determine whether the transition period has ended (e.g., whether the transition timer has expired). If the transition period has ended (step 1312: yes), the runtime 248 may proceed to step 1320, as will be described in further detail below. If the transition period has not ended (step 1312: no), the runtime 248 may proceed to step 1314.

In step 1314, the runtime 248 may determine whether it has received, from the worker 560 (e.g., the incumbent worker), state update(s) for one or more components being handed over to the new worker. For example, the worker 560 may send any final component states and/or commands to the runtime 248 so that the new worker has the appropriate information for taking over authority of the component. If a state update has not been received (step 1314: no), the runtime 248 may proceed to step 1316. If, on the other hand, a state update has been received from the worker (step 1314: yes), the runtime 248 may store the state update in step 1318. The runtime 248 may provide the state information to the new worker to complete the handover.

In step 1316, the runtime 248 may determine whether it has received, from the worker 560, a message indicating that the worker 560 is ready to lose authority. For example, the worker 560 may determine that it is ready to lose authority prior to the end of the transition period. If the runtime 248 did not receive a message from the worker 560 that it is ready to lose authority (step 1316: no), the runtime 248 may return to step 1312 to determine whether the transition timer has expired. If the transition timer has expired (step 1312: yes) or the runtime 248 receives a message from the worker 560 that it is ready to lose authority (step 1316: yes), the runtime 248 may proceed to step 1320 to complete the handover. The effect of this system may be that if a worker is responding quickly, the worker may have time to react to loss of authority by saving its state. However, if a worker is not responding quickly (e.g., because the worker is overloaded or has crashed), the runtime can still load balance and move work around to improve the health and efficiency of the system.

In step 1320, the runtime 248 may transmit, to the worker 560, a message indicating that the worker 560 is not authoritative over the component. For example, the runtime 248 may transmit, to the worker 560 and after a configurable amount of time, the message notifying the worker 560 that it has lost authority.

In step 1322, the runtime 248 may transmit, to the new worker, a message indicating that the new worker is authoritative over the component. The message may indicate the component and/or one or more states of the component. The state(s) of the component may be the final state(s) of the component received from the worker 560 after the worker 560 was notified of the imminent loss of authority. Alternatively, the state(s) of the component may be the most recent received state(s) of the component saved by the runtime 248, such as if the worker 560 did not respond to and/or did not receive the authority lost imminent message from the runtime 248. Thus, the runtime 248 may complete the handover or transition to the new worker even if the incumbent worker 560 did not respond, such as if the incumbent worker 560 was busy handling other requests. Accordingly, the runtime 248 may continue to load balance worker processes, and the simulation 410 may continue to run efficiently, even if one or several workers are overloaded. The runtime 248 may also notify the new worker of any buffered commands received during the transition period, and the new worker may implement one or more of those buffered commands.

Figure 14:
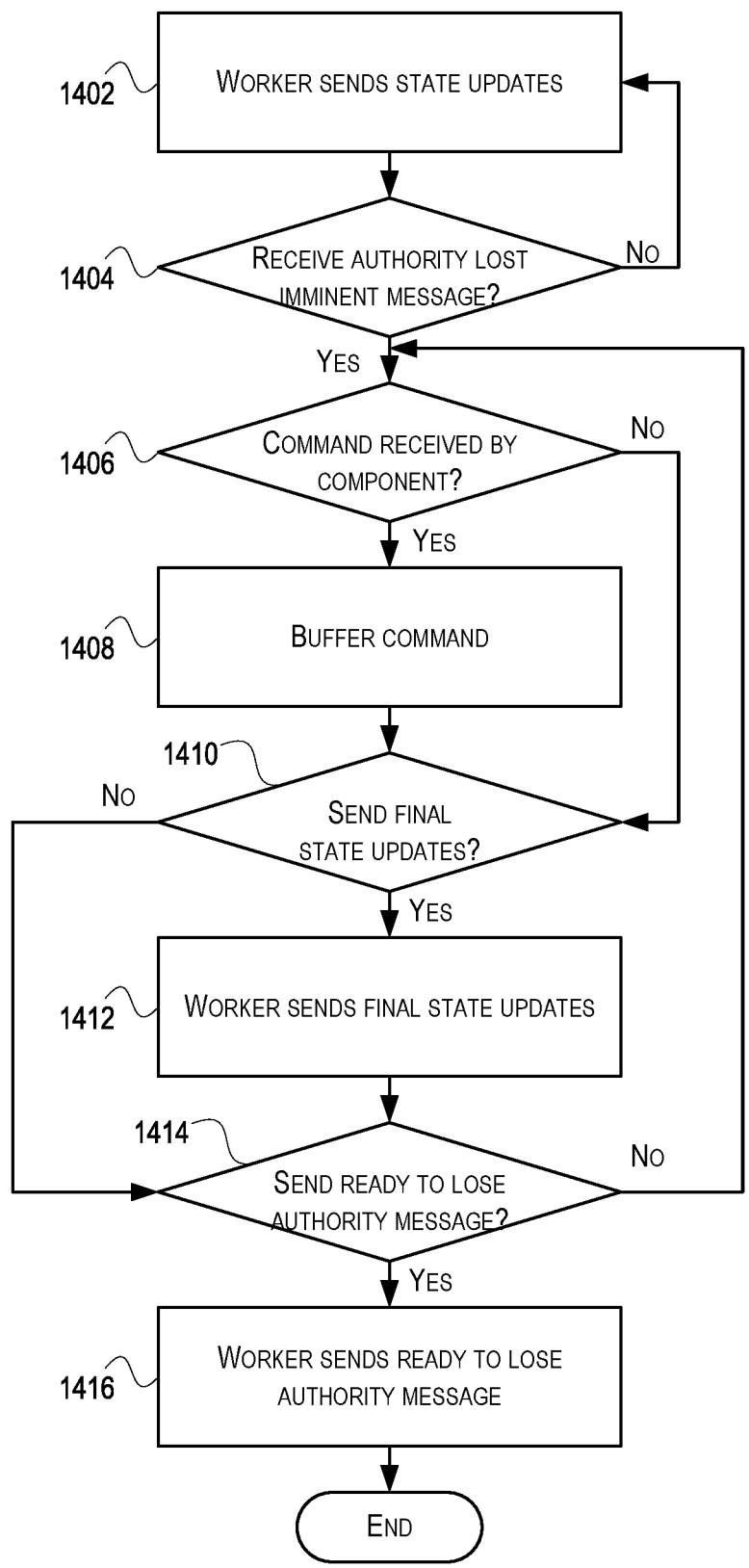
FIG. 14 depicts a flowchart that illustrates another method of handing over authority over one or more components from one worker process to another worker process within a spatially-optimized simulation in accordance with one or more illustrative aspects described herein.

FIG. 14 depicts a flowchart that illustrates another method of handing over authority over one or more components from one worker process to another worker process within a spatially-optimized simulation. The algorithm shown in FIG. 14 and other similar examples described herein may be performed in a computing environment such as the system illustrated in FIGS. 3-6, as well as other systems having different architectures (e.g., all or part of FIGS. 1-2.) The method illustrated in FIG. 14 and/or one or more steps thereof may be embodied in a computer-readable medium, such as a non-transitory computer readable memory. In some aspects, one or more of the steps illustrated in FIG. 14 may be performed by an incumbent worker, such as worker 560.

As previously described, the worker 560 may implement, during a simulation 410, the behavior of a component that the worker 560 has authority over (e.g., component 510). For example, the worker 560 may write to properties of the component 510, communicate with the component 510 to implement an action by the component 510, cause events to be output by the component 510, etc.

Referring to FIG. 14, in step 1402, the worker 560 may send, to the spatial simulation runtime 248, state updates to the component 510, during implementation of the behavior of the component 510. The transmission may occur, for example, infrequently, periodically, and/or in response to an update to the state of the component 510. As previously described, the worker 560 may communicate the state updates to the simulation runtime 248 via a bridge (e.g., bridge 610). Each of the plurality of workers in the simulation 410 may similarly send, to the runtime 248, updates to internal states. Because the worker 560 may send updates infrequently, such as in normal running conditions, even if the worker 560 crashes or the system is restored from a snapshot, not too much state is lost (e.g., at most the amount of state updated between two infrequent updates).

In step 1404, the worker 560 may determine whether it has received, from the runtime 248, a message indicating that the worker 560 will lose authority over the component 510. If not (step 1404: no), the worker 560 may return to step 1402 to implement behavior of the component 510 and/or send state updates to the runtime 248. If, on the other hand, the worker 560 received a message indicating that the worker 560 will lose authority over the component 510 and/or other components (step 1404: yes), the worker 560 may determine that it is in a handover transition period and may proceed to step 1406. As previously described, the message may indicate the start time, duration, and/or end time of the transition period. In some aspects, the bridge 610 may notify the worker 560 of a change in state to authority loss imminent.

In step 1406, the worker 560 may determine whether it received, during the transition period, one or more commands to be performed on or by the component 510. If the worker 560 did not receive a command (step 1406: no), the worker 560 may proceed to step 1410. If, on the other hand, the worker 560 receives one or more commands during the transition period (step 1406: yes), the worker 560 may proceed to step 1408 and buffer or otherwise store the command (e.g., instead of executing the command). By buffering the commands, commands and/or other data may be saved, even during a handover scenario. The received commands may be responded to with an authority moved message when the new worker has become authoritative. The worker 560 may transmit, to the runtime 248, an indication of the command(s) received during the transition period, so that the new worker may implement those command(s). In some aspects, if a component update arrives at the bridge associated with the worker 560 (e.g., bridge 610) before the timeout, the bridge may still believe it is authoritative for the component and may issue the update.

In some aspects, commands may be short-circuited. For example, a worker may issue a command to an entity component that the same worker is actually authoritative for. Instead of performing a round-trip from the worker to the bridge and back to the same worker (which may take more time), the worker may process the command itself without using or hitting the bridge (e.g., short-circuit the bridge). In a handover scenario (e.g., during a transition period), a worker 560 losing authority might not short-circuit commands after receiving the authority lost imminent message. Instead, the worker 560 may send the command to the runtime 248, and the command may be executed by the new worker once the new worker is authoritative.

In step 1410, the worker 560 may determine whether to send, to the runtime 248, any final state updates for the component 510. For example, the worker 560 might not need to send a final state update if it previously sent the update to the runtime 248, such as during a routine or periodic update message sent to the runtime 248 (e.g., in step 1402). If the worker 560 does not have an update to send (step 1410: no), the worker 560 may proceed to step 1414. If the worker 560 has a state update to send to the runtime 248 (step 1410: yes), the worker 560, in step 1412, may transmit, to the runtime 248, the state update. Accordingly, after receiving the losing authority message from the runtime 248, the worker 560 may have the chance to send any final component updates. As noted above, this may be provided on a best effort basis. If a worker or the runtime is slow, the transition period may timeout and the worker may lose authority before receiving a losing authority notification.

In step 1414, the worker 560 may determine whether to send, to the runtime 248, a message indicating that the worker 560 is ready to lose or relinquish authority. When the worker 560 is ready to lose authority may depend on the kind of work being undertaken by the worker 560. For example, an AI worker may know that it is ready to lose authority after the worker has serialized and sent the worker's last update for the AI state component of the entity to the runtime. As another example, an inventory worker may know that it is ready to lose authority after the worker has successfully committed any pending inventory transactions to an external database the worker was connected to. If the worker 560 determines not to send the ready to lose authority message (step 1414: no), the worker 560 may return to step 1406 to determine whether another command for a component managed by the worker 560 has been received. If, on the other hand, the worker 560 determines to send the ready to lose authority message (step 1414: yes), the worker 560, in step 1416, may send, to the runtime 248, a message indicating that the worker 560 is ready to lose authority. In some aspects, the worker 560 may notify the bridge 610 that it is ready to release its authority over a component. Accordingly, the worker 560 may be able to notify the runtime 248 (e.g., via the bridge 610) that it is ready to lose authority before the transition period has elapsed. If a bridge associated with the worker 560 (e.g., bridge 610) receives a relinquish message before the timeout for the transition period, the bridge 610 may relinquish authority and may allow any component updates to move to the new worker.

As previously described, the runtime 248 may complete handover of authority of a component 510 from the worker 560 to a new worker in response to receiving the ready to lose authority message from the worker 560. Alternatively, the runtime 248 may complete the handover after the transition time period has expired. The worker 560 may receive, from the runtime 248, a message indicating that the worker 560 is no longer authoritative over the component 510. The new worker may request, from the runtime 248, information the new worker uses to simulate the entity it is about to become authoritative for. For example, the new worker may ask the runtime 248 for the state of the world surrounding the entity. Once the new worker receives the message indicating that the new worker is now authoritative, the new worker may begin simulating the entity and sending updates to the runtime 248 updating the component the new worker is now authoritative for.

Various metrics for the handover techniques described herein may be collected. A authority_handover_timeouts metric may comprise a counter of the number of times that authority is removed without receiving a relinquish authority from the worker. A authority_handover_total metric may comprise a counter of the number of times that authority is removed. A authority_handover_time metric may comprise a histogram with the time it takes between sending a losing authority message and receiving a relinquish authority message or timing out. A authority_handover_dropped_component_updates metric may comprise a counter of the number of times that a component update was dropped by the bridge due to the worker sending it too late. A authority_handover_component_updates_total metric may comprise a counter of the number of times a component update was sent during the handover period. A authority_handover_dropped_commands metric may comprise a counter of the number of times a command was dropped due to a worker change authority. The system may also log instances where a user attempts to send updates, but have configured a 0 timeout.

Various edge use cases may exist.

Gaining authority while losing authority: this may occur if an entity-component authority thrashes, and the original worker that loses authority regains authority before authority is relinquished. In this scenario, the worker may receive a AuthorityChanged (NON_AUTHORITATIVE) followed by an AuthorityChanged (AUTHORITATIVE) callback.

Authority thrashes between two workers: this may be similar to the previous edge use case, but where the authority of an entity-component thrashes for a long period. In this scenario, after a worker has released authority, the newly authoritative worker at that time (e.g., according to the entity) may be made authoritative.

Losing authority before the original worker has lost authority: this may occur where worker A loses authority to worker B, but worker B loses authority to worker C before worker A has relinquished authority. In this scenario, worker B might not get an authority changed message. As previously described, a gaining authority state may be used to address this scenario.

Component Updates being received after the authority time out has expired: this may occur where worker A believes it is in the AUTHORITY_LOSS_IMMINENT state and tries to send a component update. However, from the perspective of the runtime, worker A may have already lost authority. In this scenario, a metric counter may be incremented, and the update may be dropped.

The worker API may also comprise functions for notifying other workers that the properties of a component for which worker 560 is authoritative have changed state. For example, worker API wrapper 630 may comprise a method to be called by worker API wrapper 630 when the properties of a component for which worker 560 is authoritative have changed state. Method 7 is one example of a method signature that may be used to update the properties of the components for which worker 560 is authoritative.

Method 7:
    void UpdateState_Component1(EntityId eid, SomeState state); where
        eid is a value which may uniquely identify the entity which may comprise the component whose properties changed state; and
        state is a data structure and/or object which may describe the updated state of the component.

Although Method 7 is provided as an example for updating the properties of the components for which worker 560 is authoritative, various other methods and/or functions may be used. For instance, other parameters may be included in the method without departing from the disclosure. Method 7 may be called whenever the properties of a component for which worker 560 is authoritative have changed state.

Optionally, worker 560 may be configured to periodically send a heartbeat signal to bridge 610. If or when worker 560 ceases to transmit heartbeat signals, bridge 610 may determine that worker process 560 may have terminated unexpectedly. In response to the determination, bridge 610 may terminate cleanly and request that a replacement worker process 560 (and new counterpart bridge 610) be allocated and instantiated.

Figure 7:
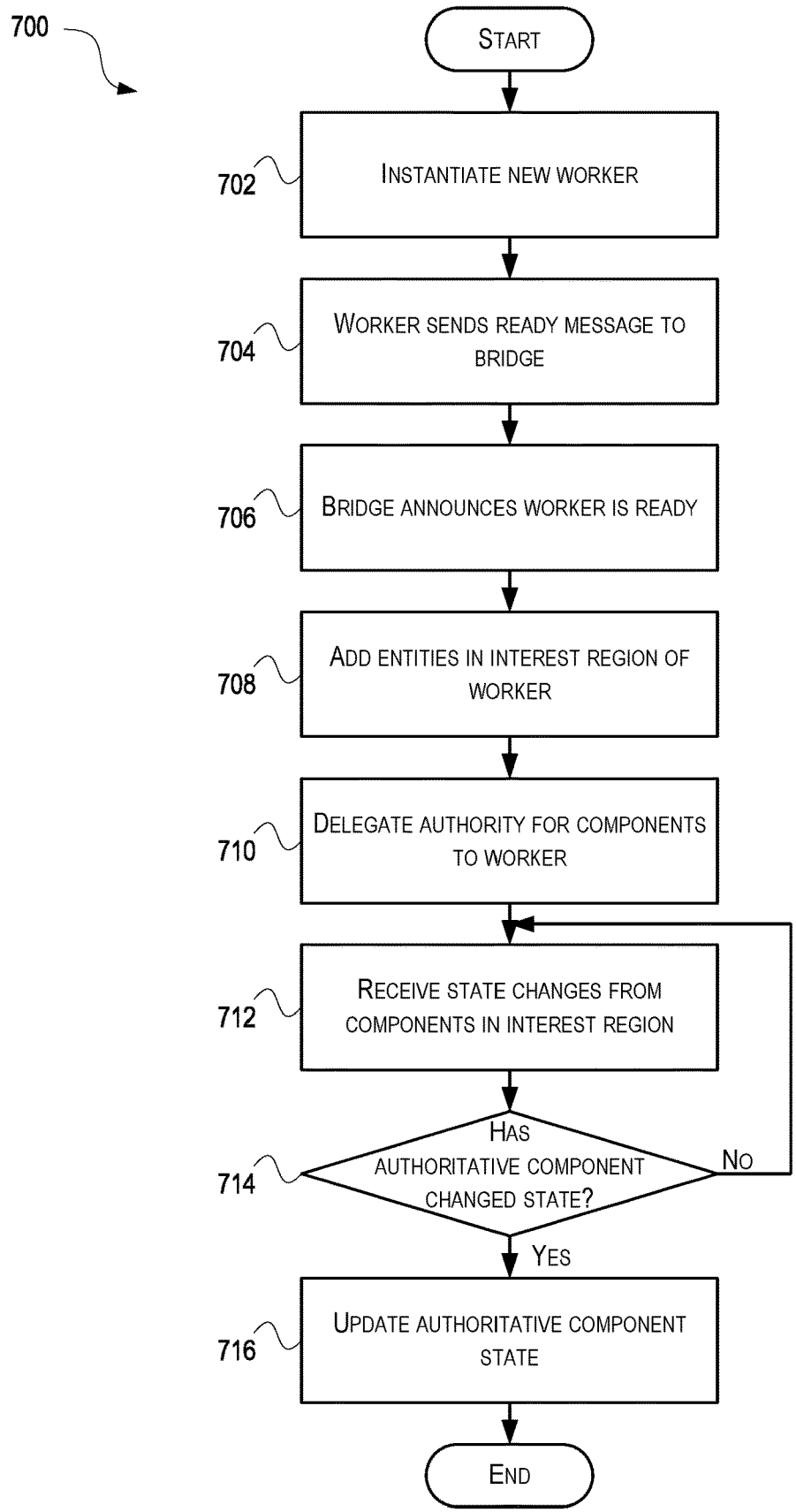
FIG. 7 illustrates a flow chart of a method used to register a worker process according to one or more illustrative aspects described herein.

FIG. 7 depicts a flowchart that illustrates a method of registering a worker process with a spatially-optimized simulation. The algorithm shown in FIG. 7 and other similar examples described herein may be performed in a computing environment such as the system illustrated in FIGS. 3-6, as well as other systems having different architectures (e.g., all or part of FIGS. 1-2.) The method illustrated in FIG. 7 and/or one or more steps thereof may be embodied in a computer-readable medium, such as a non-transitory computer readable memory.

Referring to FIG. 7, step 702, a spatial simulation runtime 248 may have instantiated and provisioned a server worker process 249 on a virtual server 202 based on a determination that a new worker 560 instance was needed. For example, spatial simulation runtime 248 may have detected increased simulation workload which may require an additional worker 560 instance to be created. In another example, spatial simulation runtime 248 may have detected that a pre-existing worker instance may have crashed and must be replaced by a new worker 560 instance. In step 704, worker 560 may send a message or otherwise signal to bridge 610 that worker 560 is ready to accept simulation work. In response to the receipt of the ready message from worker 560, bridge 610 may announce to the spatially-optimized simulation 410 that worker 560 is ready to accept simulation work, as shown in step 706. A spatial simulation runtime 248 may, in step 708, cause bridge 610 to add one or more entities to the interest region of worker 560. For example, bridge 610 may call an OnEntityAdd method in worker API wrapper 630 to add each of the one or more entities. A spatial simulation runtime 248 may, in step 710, cause bridge 610 (or other entity or module) to delegate write authority of one or more components to worker 560. For example, bridge 610 may call an OnComponentDelegate method in worker API wrapper 630 to delegate authority for each of the one or more components. In step 712, bridge 610 may notify worker 560 that one of the components within the interest region for worker 560 has changed state. For example, bridge 610 may call an OnStateChanged_Component1 method in worker API wrapper 630 to notify worker 560 of the change in the state of the component. Worker 560 may recalculate the state for each of the one or more components for which is it authoritative. If or when worker 560 determines, in step 714, that the state of a component has changed, then worker API wrapper 630 may call an UpdateState_Component1 method for each one of the one or more components whose state has changed, as shown in step 716, and the method ends. If or when worker 560 determines, in step 714, that none of the components have changed state, then worker 560 may return to step 712 and wait for another notification of a change in the state of the component in the interest region for worker 560.

Figure 8A:
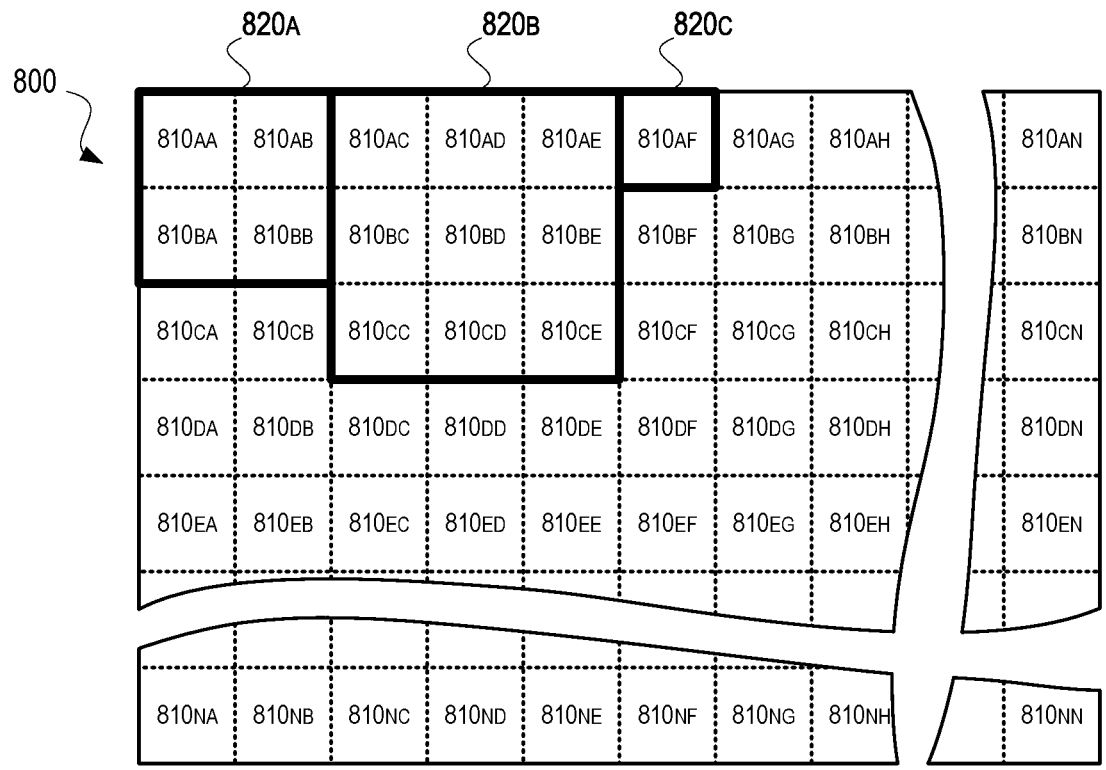
FIGS. 8A-8C depicts an illustrative spatially-optimized simulated world that may be used in accordance with one or more illustrative aspects described herein.

FIG. 8A illustrates one example of a spatially-optimized simulated world 800 that may be implemented according to one or more illustrative embodiments of the disclosure. As shown in FIG. 8A, spatially-optimized simulated world 800 may be sub-divided into a plurality of chunks or regions. Although FIG. 8A illustrates a spatially-optimized simulated world 800 and chunks using two dimensions, those of skill in the art will appreciate that a spatially-optimized simulated world 800 and chunks may comprise one or more dimensions, as may be specified by a simulation developer. For example, a one-dimensional spatially-optimized simulated world 800 may be represented by a line and chunks may comprise portions of the line. In another example, spatially-optimized simulated world 800 may simulate a three-dimensional (3D) world and chunks may comprise three-dimensional portions (e.g., sphere, cube, etc.) of the 3D simulated world. Each chunk may be controlled by a chunk actor (e.g., chunk module), which is the program, process, routine, or agent responsible for content within that chunk.

Each chunk actor 810aa-810nn (generally 810) may be allocated to a chunk server (e.g., 820a-820c) such as the server illustrated in FIGS. 2-3 (e.g., 240a-240n, 202a-202f), as well as other systems having different architectures (e.g. all or part of FIG. 1.) A subset of chunk actors 810 may be allocated to the same chunk server such that the functionality associated with the subset of chunk actors 810 may be provided by the chunk server. For example, chunk actors 810aa, 810ab, 810ba, and 810bb may be allocated to a chunk server 820a; chunk actors 810ac, 810ad, 810ae, 810bc, 810bd, 810be, 810cc, 810cd, and 810ce may be allocated to a chunk server 820b; and chunk actor 810af may be allocated to a chunk server 830c. Chunk server allocation of chunk actors 810 may be based on a number of factors. Chunk actors 810 may be allocated to a chunk server 820 based on their relative locations. For example, chunk actors 810aa, 810ab, 810ba, and 810bb may be allocated to a chunk server 820a based on their being adjacent to each other. Such an allocation may be advantageous as it may reduce network traffic and latency as adjacent chunk actors are more likely to communicate with each other than chunk actors 810 which are located far away for each other. Optionally, chunk actors 810 may be allocated to a chunk server 820 based on chunk processing workload and available server processing resources. For example, the processing load of a chunk actor 810 may be determined based on the number of entities comprised within its chunk or region. Based on such a determination, chunk actors 810 may be allocated to a chunk server 820 until a predetermined indication of server load is achieved. In such a scenario, chunk actors 810 (i.e., 810ac, 810ad, 810ae, 810bc, 810bd, 810be, 810cc, 810cd, and 810ce) may be allocated to a chunk server 820b until chunk server 820b reaches a predetermined server load value. In yet other examples, each chunk server 820 may be allocated a predetermined number of chunk actors. For example, chunk server 820c may be allocated one chunk actor 810 (i.e., 810af.)

Figure 8B:
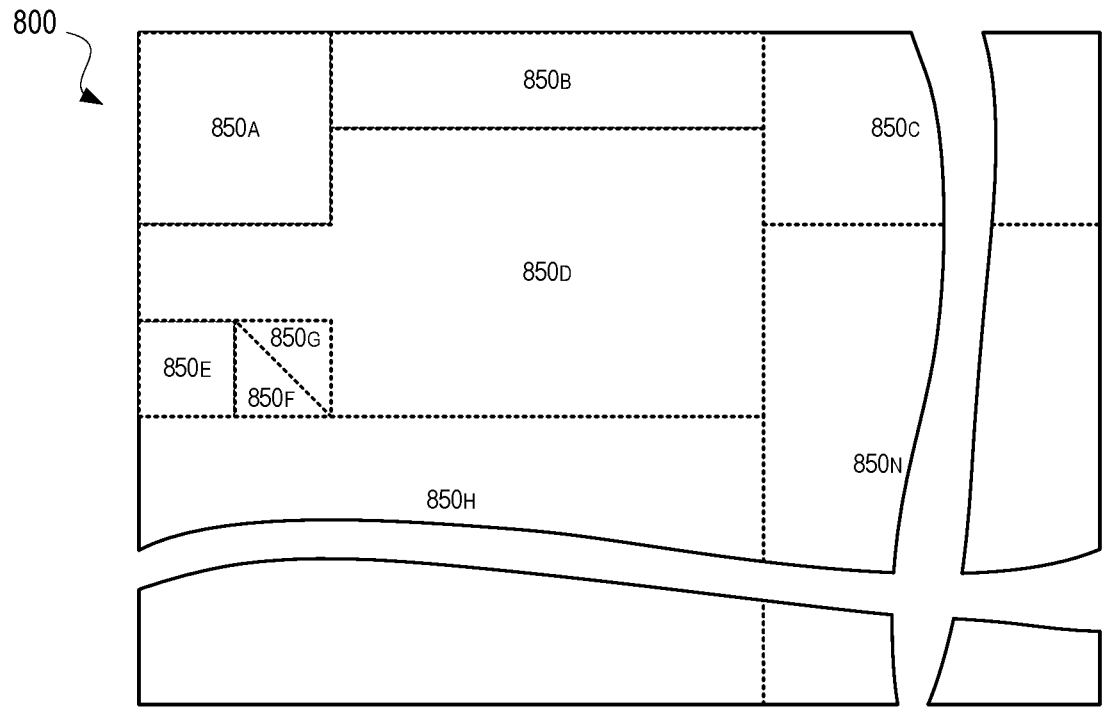

As a spatially-optimized simulation 800 progresses, the location and quantity of entities represented within the simulated world may change. As shown in FIG. 8B, the chunks or regions assigned to chunk actors 850a-850n may change in size, shape, and quantity as needed based on the instantaneous state of the spatially-optimized simulation 800. Optionally, chunk actor 850 may be assigned to a portion of a spatially-optimized simulated world 800 based on the location, quantity, and density of entities within the assigned chunk. For example, the size of a chunk assigned to chunk actor 850 may be reduced as the number of entities migrating to the assigned chunk increases. For example, the chunks assigned to chunk actors 850f and 850g may comprise a higher density of entities than the chunks assigned to chunk actor 850d. In other examples, the size and shape of a chunk region may be determined based on the workload associated with the entities located within the chunk region. For example, the processing load, or another value indicative of the workload, of a chunk actor 850 may be determined based on the number and/or type of entities and components comprised within its chunk or region. Based on such a determination, the size and shape of a chunk or region allocated to chunk actors 850 may be adjusted until a predetermined indication of workload is achieved. In yet other examples, the size, shape, and quantity of the chunks assigned to chunk actors 850 may remain unchanged as the spatially-optimized simulation 800 progresses. For example, chunk actors and their assigned regions may remain as shown in FIG. 8A. Server allocation of chunk actors 850 may also vary (not shown) based on similar factors as those discussed in detail above with reference to FIG. 8A.

Figure 8C:
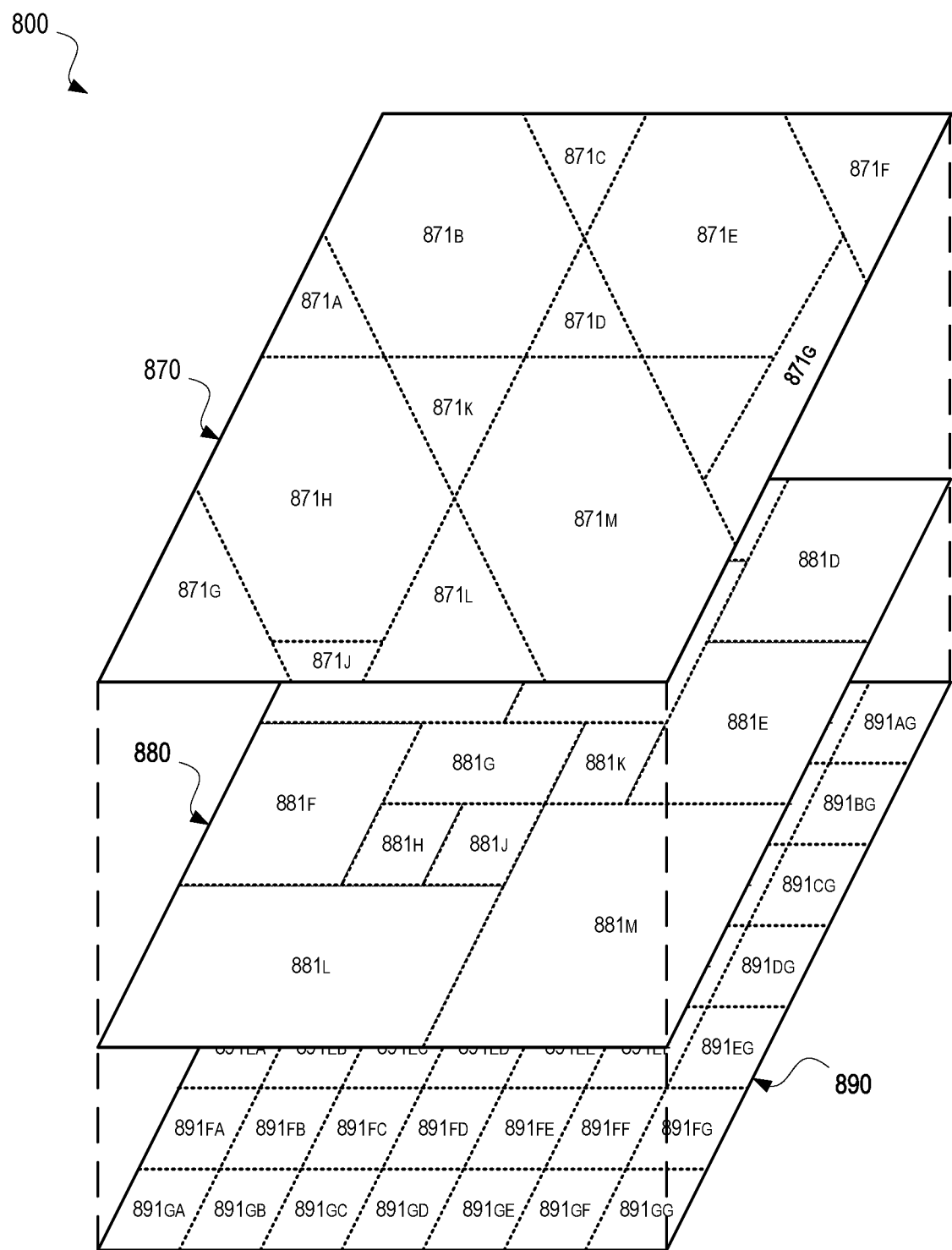

Additionally, chunk actors may be logically grouped into chunk actor layers. FIG. 8C illustrates one example of a spatially-optimized simulated world comprising chunk actor layers 870, 880, and 890. The spatially-optimized simulated world illustrated in FIG. 8C may be similar to the spatially-optimized simulated world illustrated in FIGS. 8A-8B. Each chunk actor layer (e.g., 870, 880, and 890) may comprise one or more chunk actors. For example, chunk actor layer 870 may comprise chunk actors 871a-871m, chunk actor layer 880 may comprise chunk actors 881a-881m, and chunk actor layer 890 may comprise chunk actors 891aa-891gg. Those of skill in the art will appreciate that chunk actors 871, 881, and 891 may be grouped into any number of chunk actor layers and that each chunk actor layer may comprise different amounts of chunk actors and that the number of chunk actors comprised in each layer may vary as spatially-optimized simulation progresses, as described in detail above. Chunk actor layers 870, 880, and 890 may overlap each other and share at least a portion of the spatially-optimized simulated world. For example, as shown in FIG. 8C, chunk actor layers 870, 880, 890 cover and share all regions defined by the spatially-optimized simulated world 800. In this example, there may be three chunk actors (or two or one) for the same region of the virtual world.

Chunk actors 871, 881, and 891 may be organized into one or more chunk actor layers (e.g., 870, 880, and 890) based on one more criteria. Optionally, a chunk actor layer (e.g., 870, 880, and 890) may comprise chunk actors (e.g., 810, 850, 871, 881, and 891) which may be configured to store the canonical data of one particular type of component in the spatially-optimized simulated world. For example, chunk actor layer 870 may comprise chunk actors 871a-871m which may store the properties and state information for component A 421 and 431 as illustrated in FIG. 4. Similarly, chunk actor layer 880 may comprise chunk actors 881a-881m which may store the properties and state information for component B 422 as illustrated in FIG. 4. Spatially-optimized simulated world 800 may comprise one chunk actor layer (e.g., 870, 880, and 890) for every component type (e.g., 421-423, 432-433, and 441) comprised in the spatially-optimized simulated world 800.

Optionally, a chunk actor layer (e.g., 870, 880, and 890) may comprise chunk actors (e.g., 810, 850, 871, 881, and 891) which may comprise entities of similar size. For example, chunk actor layer 890 may comprise chunk actors 891 which may manage entities which may be small in size. Chunk actor layer 880 may comprise chunk actors 881 which may manage entities which may be generally larger than the entities in chunk actor layer 890. Additionally, chunk actor layer 880 may comprise a coarse-grained representation of the entities comprised by chunk actor layer 890. Chunk actor layer 870 may comprise chunk actors 871 which may manage entities which may be generally larger than the entities in chunk actor layer 880. Additionally, chunk actor layer 870 may comprise a coarse-grained representation of the entities comprised by chunk actor layer 880.

In yet other examples, chunk actors (e.g., 810, 850, 871, 881, and 891) may be grouped into chunk actor layers (e.g., 870, 880, and 890) based on the importance of the entities comprised by the chunk actors. For example, entities with higher importance may be grouped into higher level layers. Optionally, the spatially-optimized simulated world 800 may comprise a single chunk actor layer which may comprise all chunk actors. In such a scenario, each chunk actor may be responsible for all entities located within the region monitored by the chunk actor.

A chunk actor (810, 850, 871, 881, and 891) may monitor a set of entities which are assigned to the chunk actor and determine that an entity may need to be transferred to another chunk. For example, an entity may need to be migrated to a second chunk actor if or when the entity has moved to a region assigned to the second chunk actor. The chunk actor (810, 850, 871, 881, and 891) may determine the second chunk actor based on the current position of the entity. For example, a chunk actor (810, 850, 871, 881, and 891) may use an algorithm or mathematical expression to map the entity's position to a chunk actor region. Alternatively or additionally, the chunk actor may obtain a mapping of the entity's position. For example, snapshot 326 may comprise a map of the chunk actors in the spatially-optimized simulated world 800 and chunk actor (810, 850, 871, 881, and 891) may obtain the map to determine the identity of the second chunk actor using the current position of the entity. In another example, the spatially-optimized simulated world 800 may comprise a distributed hashtable or distributed data structure which may maintain a mapping from a position in the spatially-optimized simulated world 800 to its corresponding chunk actor. The chunk actor (810, 850, 871, 881, and 891) may query the distributed data structure and may obtain an indication of the second chunk actor.

An entity (or software simulating or representing an entity) may monitor its position or other attributes within the spatially-optimized simulated world 800 and determine whether it needs to migrate from its current chunk to another chunk. For example, an entity may change position from within the chunk of a first chunk actor (810, 850, 871, 881, and 891) to the chunk assigned to a second chunk actor (810, 850, 871, 881, and 891.) The entity may determine the second chunk actor based on the current position of the entity. For example, the entity may use an algorithm or mathematical expression to map the entity's position to a chunk actor region. Alternatively or additionally, the entity may obtain a mapping of the entity's position. For example, the entity may obtain the mapping from snapshot 326 or, in another example, the entity may obtain the mapping from a distributed hashtable or distributed data structure. If or when an entity determines the need to migrate to a second chunk actor, then the entity may notify its current chunk actor and request to be migrated to the second chunk actor.

A first chunk actor may migrate an entity to a second chunk actor by communicating directly, in a peer-to-peer fashion, with the second chunk actor. The first chunk actor may forward the entity's state information to the second chunk actor and the second chuck actor may start monitoring and receiving state change notifications for the migrated entity. The first chunk actor may also stop monitoring and receiving state change notifications from the migrated entity.

A chunk actor (810, 850, 871, 881, and 891) may monitor and receive state change notifications from all assigned components for all the entities located within its corresponding chunk. The chunk actor (810, 850, 870, 880, and 890) may store the states of the assigned components in the local memory of the chunk server 820 allocated to the chunk actor for access during execution of the spatially-optimized simulation. In some examples, the states of the assigned components may be stored in cloud-based data store 320 as part of a snapshot 326 and thus may be persisted across simulation runs. The snapshot 326 may also be used to restore a chunk server 320 if or when the chunk server 320 has terminated unexpectedly.

The rate at which components emit state change notifications and the rate at which the state changes are stored may be determined by one of a multiple of data policies implemented by the chunk actor (810, 850, 871, 881, and 891.) State change notifications may be emitted based on the distance between the emitting and the receiving entities. If or when the receiving entity is a large distance away from the emitting entity, the emitting entity may publish state changes at a slower rate. Additionally, the emitting entity may reduce the period of time between state change notifications if or when the receiving entity is closer. In such a scenario, the emitting entity may calculate or determine the state at the same rate; the calculation rate may be unaffected by the distance changes. Thus, allowing an entity to publish state changes at varying rates to multiple receiving entities.

Figure 9:
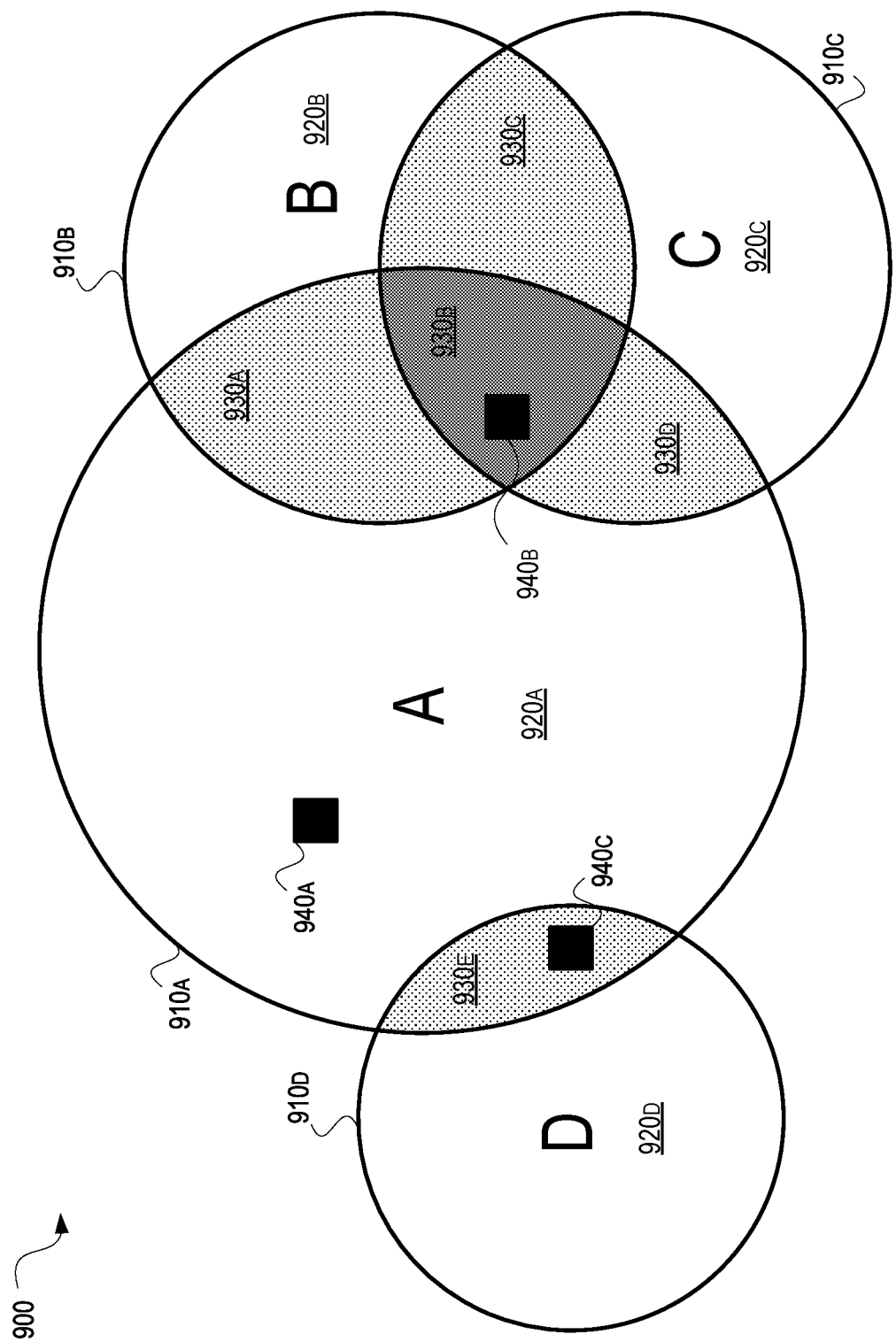
FIG. 9 depicts an example of worker interest regions in accordance with one or more example embodiments.

The publishing rate may be determined based on overlap of interest regions. FIG. 9 illustrates one example of a representation of the interest region of a worker that may be implemented according to one or more illustrative embodiments of the disclosure. Interest regions A, B, C, and D (i.e., 910a-910d) may represent the interest regions for workers A, B, C, and D (not shown), respectively, within a spatially-optimized simulated world 900. Workers A, B, C, and D may incorporate and/or otherwise include one or more aspects of worker 560 illustrated in FIGS. 5-7. Although FIG. 9 illustrates interest regions 910 using two dimensions, those of skill in the art will appreciate that interest regions may comprise up to as many dimensions as are simulated by the spatially-optimized simulated world. For example, interest regions 910 may comprise three dimensions in a 3D simulated world.

An interest region may overlap with one or more other interest regions. As shown in FIG. 9, interest region A 910a may overlap with interest region B 910b in regions 930a, with interest region C 910c in region 930d, and with interest region D 910d in region 930e. Similarly, interest region B 910b may overlap with interest region C 910c in region 930c. Interest regions A, B, and C (i.e., 910a-910c) may all overlap in region 930b. Regions 920a-920d may indicate regions with no overlap. In other examples, not shown, various interest regions may overlap or not in various other combinations.

An entity (e.g., 940a-940c) may publish (or have published on its behalf) state change notifications at a low rate if or when the entity is located within a portion of its authoritative worker's interest region that does not overlap with any other worker's interest region. For example, entity 940a may publish state change notifications at a slower rate if or when it may be located within region 920a. An entity (e.g., 940a-940c) may publish state change notifications at a medium rate if or when the entity is located within a portion of its authoritative worker's interest region that does overlap with any other worker's interest region. For example, entity 940c may publish state change notifications at a normal rate if or when it may be located within region 930e. An entity (e.g., 940a-940c) may publish state change notifications at a high rate if or when the entity is located within a portion of its authoritative worker's interest region that does overlap with two or more other worker's interest region. For example, entity 940b (or a worker) may publish state change notifications at a higher rate if or when it may be located within region 930b.

Alternatively, an entity may implement multiple separate components which publish their properties at different rates. For example, a vehicle entity may implement a high-fidelity position component that publishes the vehicle's position at a high rate, and a second low-fidelity position component that publishes the vehicle's position at a low rate. Other entities may choose to monitor either the high-fidelity or low-fidelity component.

Figure 10:
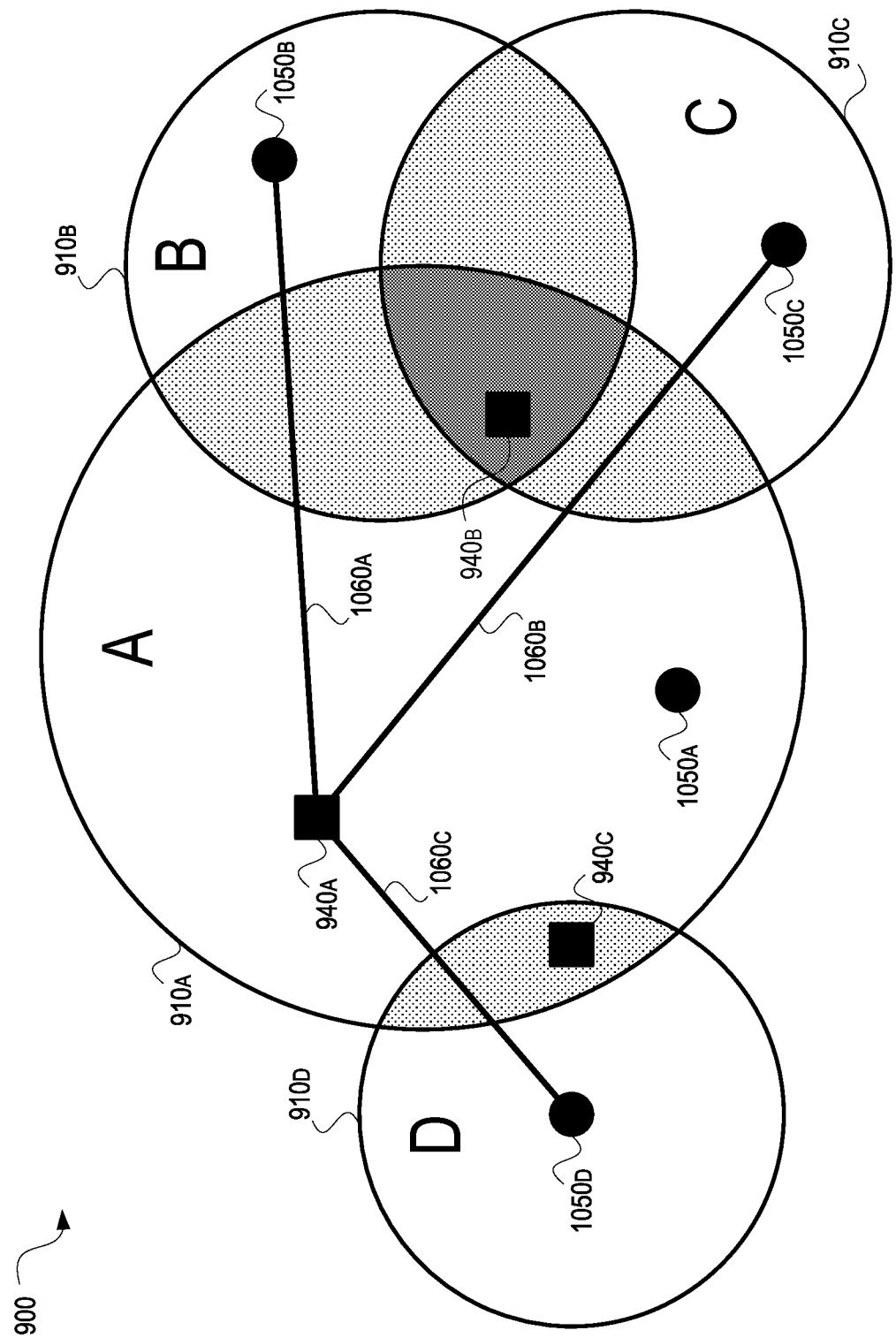
FIG. 10 depicts another example of worker interest regions in accordance with one or more example embodiments.

FIG. 10 illustrates another example of a representation of the interest region of a worker that may be implemented according to one or more illustrative embodiments of the disclosure. Interest regions A, B, C, and D (i.e., 910a-910d) may represent the interest regions for workers A, B, C, and D (not shown), respectively, within a spatially-optimized simulated world 900. Workers A, B, C, and D may incorporate and/or otherwise include one or more aspects of worker 560 illustrated in FIGS. 5-7 and 9. Although FIG. 10 illustrates interest regions 910 using two dimensions, those of skill in the art will appreciate that interest regions may comprise up to as many dimensions as are simulated by the spatially-optimized simulated world. For example, interest regions 910 may comprise three dimensions in a 3D simulated world.

Optionally, a worker process (e.g., 560, workers A, B, C, and D) may periodically determine a load metric. The load metric may be a value indicative of the instantaneous workload on the worker process and its ability to perform additional simulation computation work. For example, a load metric may consist of a value between 0 and 1 where a value of 1 may indicate a worker which is unable to accept additional work. A worker process (e.g., 560, workers A, B, C, and D) may periodically transmit its load metric to chunk actor(s) responsible for the chunk region(s) covered by the worker's interest region. A worker process (e.g., 560, workers A, B, C, and D) may periodically calculate a load density center (e.g., 1050a-1050d). The load density centers 1050 may represent a center of mass for interest region 910 wherein the "mass" relates to the computation workload of the worker process (e.g., 560, workers A, B, C, and D.) For example, interest region 910a may comprise a load density center 1050a based on the location, quantity, and processing load of the entities and components assigned to worker A. Load density centers 1050 need not be in a geometric center of interest regions 910. Worker processes (e.g., 560, workers A, B, C, and D) may update the location of their respective load density centers 1050 as spatially-optimized simulation 900 progresses and the location, quantity, density, and processing load requirements of the entities in the simulation 900 change. Load density may also be described as the processing requirement needed to simulate or represent a unit of space, area or other portion of the virtual simulation or world. A load density center may also be described as a mean position of computational requirements for a particular body, or portion of the virtual simulation or world, for example.

A chunk actor (e.g., 810, 850, 871, 881, and 891) may monitor the load metrics and load density centers reported by the workers within its chunk region. Based on the monitoring, a chunk actor may determine whether a worker may be at or over maximum processing capacity. Based on the determination, the chunk actor may attempt to reduce the worker's processing workload. In one example, the chunk actor may remove delegation authority for one or more entities from the worker process, which may reduce the worker's load metric and may shrink the worker's interest region. The chunk actor may then move the delegation authority of the one or more entities to one or more other worker processes. For example, referring to FIG. 10, a chunk actor (not shown) may determine to move entity 940a (or other entity) from worker A to either worker B, worker C, or worker D based on a load balancing algorithm. Based on the monitoring, a chunk actor may alternatively determine whether a worker process may be at or under a minimum processing capacity. Based on the determination, the chunk actor may move all entities currently assigned to the respective worker process to another worker process based on the load balancing algorithm.

Based on the load balancing algorithm, a chunk actor may determine one or more candidate worker processes which may receive delegation authority of the one or more entities being removed from the overloaded worker process. A chunk actor may determine an initial list of candidate worker processes based on the workers which receive notifications from the overloaded worker. For example, an initial list of candidate worker processes may comprise worker processes whose interest regions overlap with the interest region of the overloaded worker. For example, workers B, C, and D may comprise an initial list of candidates for worker A, as shown in FIG. 10. A chunk actor may remove candidate worker processes from the initial list if or when a candidate worker process may be reporting a load metric that is above a predetermined threshold. Optionally, a chunk actor may be configured to determine a tensile energy for each of the one or more entities being migrated. A chunk actor may determine the tensile energy U of an entity with respect to a worker process based on a distance x (e.g., 1060a-1060c) between the entity (e.g., 940a) and the load density center 1050 of the respective worker and a spring constant, K (e.g., $U=\frac{1}{2} Kx^2$). For example, a chunk actor determining to migrate entity 940a may determine a first energy between entity 940a and worker B based on distance 1060a and spring constant K. The chunk actor may determine a second energy between entity 940a and worker C based on distance 1060b and spring constant K, and a third energy between entity 940a and worker D based on distance 1060c and spring constant K. The chunk actor may compare all of the calculated energies and determine a receiving worker which minimizes the energy between the entity and the receiving worker process. Spring constant K may be a predetermined value which may remain unchanged as the spatially-optimized simulation 900 progresses. In other scenarios, spring constant K may change as time progresses or based on other parameters.

In other examples, a worker process (e.g., 560, workers A, B, C, and D) may periodically relocate its interest region based on a determination of an average position of all the entities for which the worker is authoritative. For example, a worker process may move the center of its interest region (or otherwise have it moved) to the average position of all the entities for which the worker process is authoritative. Additionally, the worker process may be configured to increase or reduce in size its interest region based on its current load metric. For example, a worker process may increase a maximum simulation radius of its interest region if or when the current load metric decreases. Similarly, a worker process may decrease a maximum simulation radius of its interest region if or when the current load metric increases. In such a scenario, a chunk actor may determine a receiving worker based on the distance between the entity (e.g., 940a) and the center of the interest region of the respective worker and whether the entity is within the maximum simulation radius for the receiving worker. In yet other examples, the number and position of worker processes may remain unchanged throughout the simulation and a chunk actor may determine a receiving worker for an entity based on the location of the entity and which worker process is located closest to the entity.

A chunk actor (810, 850, 871, 881, and 891) may assign a worker process to all components of the same type comprised by the entities assigned to the chunk actor. In this manner, a worker process may simulate all the components of a certain type or all the components within a chunk region. A chunk actor (810, 850, 871, 881, and 891) may comprise multiple worker processes which may be authoritative for several entities within the chunk region.

Alternatively, the chunk actor may determine that all candidate worker processes have a load metric above the predetermined threshold. For example, a chunk actor determining to migrate entity 940a from worker A may determine that worker B, worker C, and worker D all have a load metric above the predetermined threshold. In such a scenario, the chunk actor may be configured to cause a new worker process to be instantiated and component delegation may be transferred to the newly created worker process.

A chunk actor may be further configured to utilize one of the load balancing algorithms described in detail above if or when a worker process terminates unexpectedly. For example, as described above, a worker process may cease to transmit a heartbeat signal periodically. In such a scenario, a chunk actor may migrate the entities and components which had their write authority delegated to the terminated worker process to other pre-existing worker processes. Alternatively, the chunk actor may replace the terminated worker process with a newly instantiated worker process which may have been restored using the persisted snapshot data.

Similarly, a chunk actor may be configured to utilize one of the load balancing algorithms described in detail above to assign a worker process to a newly instantiated entity. For example, entity 940b may be a newly instantiated entity and the chunk actor may utilize a load balancing algorithm to which worker process to assign the components comprised by entity 940b. In the event that the chunk actor is unable to identify a worker process within its assigned region to assign to the newly instantiated entity, the chunk actor may attempt to assign the newly instantiated entity based on a local cache of known worker processes. For example, the chunk actor may maintain a local cache of known worker processes with which the chunk actor has communicated recently or within a predetermined period of time. Alternatively or additionally, the chunk actor may cause a new worker process to be instantiated and assigned to the newly instantiated entity.

Optionally, every entity in the spatially-optimized simulated world 900 may be configured to periodically utilize one of the load balancing algorithms described in detail above to determine whether to migrate one or more of its components to different worker process. Based on the determination and in order to effectuate the load balancing algorithm, the entity may be configured to cause a migration of the component delegation from the current worker process to another worker process.

Advantageously, and as illustrated in greater detail above, a spatially-optimized simulation development environment may automatically balance and distribute the workload across the available resources in a manner that minimizes the total amount of workers needed to perform the simulation. In addition, the spatially-optimized simulation development environment may automatically grow or shrink and move swarms of worker processes executing over possibly thousands of machines, based on the run-time workload needs of the simulation and the current location of the entities within the simulation. Furthermore, the spatially-optimized simulation development environment may dynamically recover from failures by using continuous persistence of state data and monitoring of worker process health.

Figure 11:
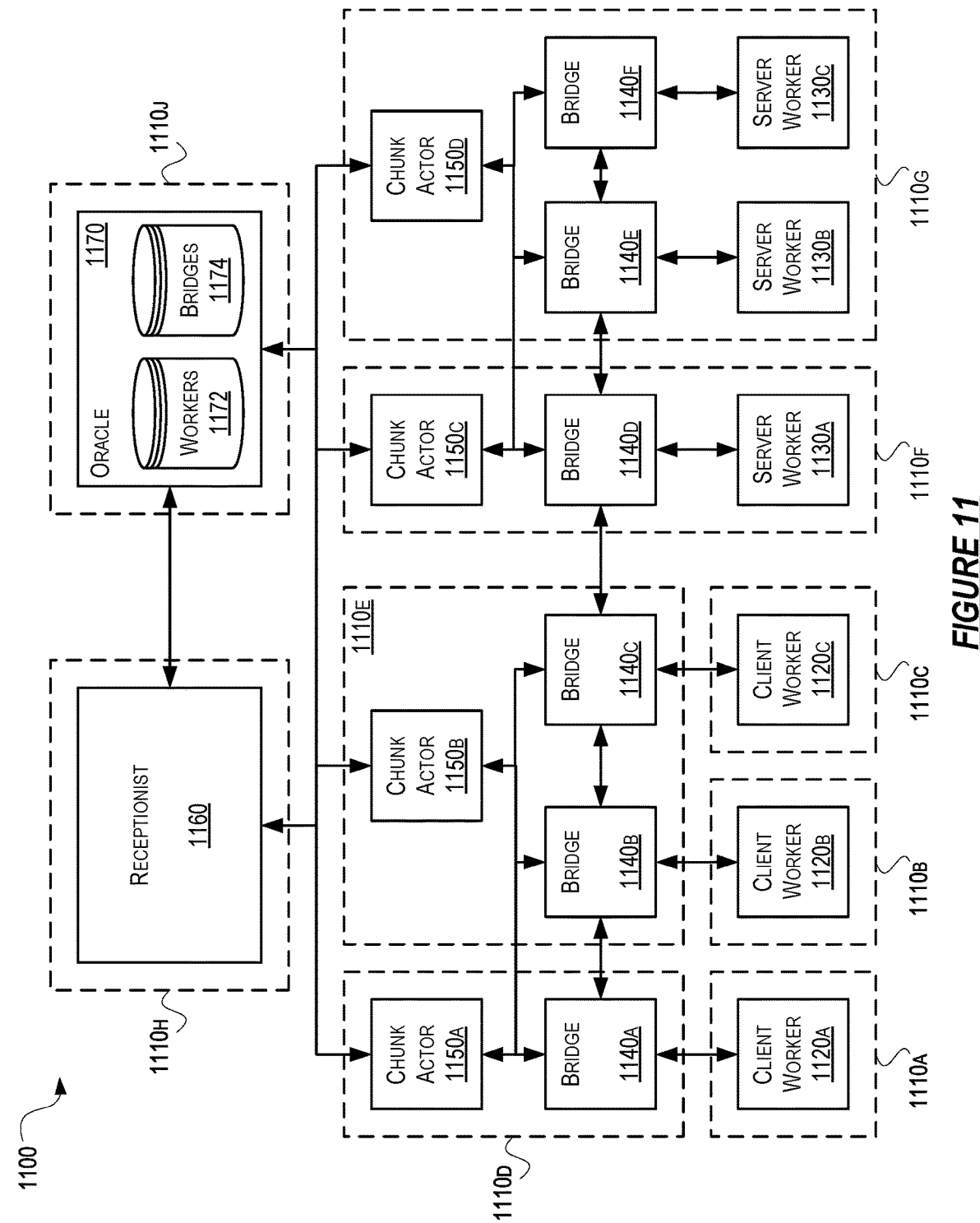
FIG. 11 depicts an illustrative high-level architecture that may be used in accordance with one or more illustrative aspects described herein.

FIG. 11 shows a high-level architecture of an illustrative spatially-optimized simulation development environment. As shown in FIG. 11, client workers 1120a-1120c may each communicate with a bridge 1140a-1140c. Similarly, server workers 1130a-1130c may each communicate with a bridge 1140d-1140f. Client workers 1120 and server workers 1130 may incorporate and/or otherwise include one or more aspects of worker 560 as illustrated in FIGS. 5-7, and workers A, B, C, and D as illustrated in FIGS. 9-10. Client worker 1120a may execute within a client computing device 1110a; client worker 1120b may execute within a client computing device 1110b; and, client worker 1120c may execute within a client computing device 1110c. Client computing devices 1110a-1110d may incorporate and/or otherwise include one or more aspects of client computing devices 340 as illustrated in FIG. 3. Computing devices 1110f-1110j may comprise a server such as the server illustrated in FIGS. 2-3 (e.g., 240a-240n, 202a-202f), as well as other systems having different architectures (e.g. all or part of FIG. 1.)

Bridges 1140a-1140f (generally 1140) may communicate with one or more chunk actors 1150a-1150d (generally 1150) in spatially-optimized simulation environment 1100. Bridges 1140 may incorporate and/or otherwise include one or more aspects of bridge 610 as illustrated in FIGS. 6-7. Bridges 1140 may also communicate with each other. Chunk actors 1150 may incorporate and/or otherwise include one or more aspects of chunk actors 810, 850, 871, 881, and 891 as illustrated in FIGS. 8A-8C.

Optionally, spatially-optimized simulation environment 1100 may comprise a receptionist module 1160. The receptionist 1160 may provide a well-known or predetermined network address. A client worker 1120 initially connecting to spatially-optimized simulation environment 1100 may connect to the receptionist module 1160 via the well-known address. The receptionist 1160 may receive a request to connect from a client worker 1120. In response to the connection request, the receptionist 1160 may determine a server 1110d-1110g in which to instantiate a bridge instance 1140 assigned to client worker 1120. For example, receptionist 1160 may base the server determination on one of the load balancing algorithms described in detail above. In such a scenario, the receptionist 1160 may utilize a load balancing algorithm to assign a server 1110 to client worker 1120. In another example, receptionist 1160 may maintain a coarse grain understanding of the interest region of each server 1110d-1110g in the spatially-optimized simulation environment 1100. In such a scenario, receptionist 1160 may base the server determination on the coarse grain understanding. In yet another example, each server 1110d-1110g may periodically determine an average spatial position of all bridge instances 1140 executing within the server 1110. In such a scenario, receptionist 1160 may assign a server 1110 to client worker 1120 based on a comparison of the server's average spatial position with the proposed spatial position of client worker 1120.

As spatially-optimized simulation 1100 progresses, bridge 1140a may be designated to be migrated from server 1110d to server 1110e based on a determination based on the load balancing algorithm described in detail above. In such a scenario, a new bridge instance 1140g (not shown) may be instantiated in server 1110e and client worker 1120a may be temporarily connected to both bridge 1140a and 1140g while the bridge migration is effectuated. Once the migration is completed, client worker 1120a may be disconnected from bridge 1140a and bridge 1140 may be terminated. In another example, bridge 1140d and server worker 1130a may be designated to be migrated from server 1110f to server 1110g. In that scenario, a new bridge instance 1140h (not shown) and a new server worker instance 1130d (not shown) may be instantiated in server 1110g. Server workers 1130a and 1130d may be temporarily connected to bridges 1140d and 1140h while the bridge migration is effectuated. Once the migration is completed, server worker 1130d may be disconnected from bridge 1140d and bridge 1140d and server worker 1130a may be terminated. Alternatively or additionally, bridge 1140d and server worker 1130a may be terminated in server 1110f and restored on server 1110g using the persisted state data in snapshot 326.

Optionally, spatially-optimized simulation environment 1100 may comprise one oracle module 1170. In yet other examples, spatially-optimized simulation environment 1100 may comprise one oracle module 1170 for each virtual server cluster as described in detail above in reference to FIG. 2. An oracle module 1170 may comprise and maintain a workers database 1172 and a bridges database 1174. The workers database 1172 may comprise data indicative of all worker instances 1120 and 1130 in a spatially-optimized simulation environment 1100. Similarly, bridges database 1174 may comprise data indicative of all bridge instances 1140 in a spatially-optimized simulation environment 1100. The oracle module 1170 may utilize the data in the workers database 1172 and the bridges database 1174 to respond to requests from a chunk actor 1150 for additional resources. For example, a chunk actor 1150 may be unable to determine a candidate worker process which may receive delegation authority. In such a scenario, chunk actor 1150 may request an additional worker process from oracle module 1170. In response, oracle module 1170 may determine whether a pre-existing worker process may be available to receive the delegation authority or whether a new worker process may need to be instantiated. Based on the determination, oracle module 1170 may respond to chunk actor 1150 with data identifying a preexisting worker process. Alternatively, oracle module 1170 may respond to chunk actor 1150 with an indication that a new worker process may need to be instantiated. The oracle module 1170 may be further configured to utilize the data in the workers database 1172 and the bridges database 1174 to terminate worker instances and bridge instances that are underutilized or unused. For example, oracle module 1170 may terminate a worker instance if or when no components are assigned to the worker instance.

Whilst the embodiments and aspects have been described in relation to virtual hardware servers, the methods and systems may also be used with other hardware or servers including local or physical servers.

Although the subject matter has been described in language specific to structural features and/or methodological acts, it is to be understood that the subject matter defined in the appended claims is not necessarily limited to the specific features or acts described above. Rather, the specific features and acts described above are described as example implementations of the following claims.

What is claimed is:

1. A method comprising:
    assigning, by a computing device and to a first worker process in a computer simulation associated with the computing device, authority over one or more components of a plurality of components, wherein the plurality of components are configured to indicate behaviors of a plurality of entities executing in the computer simulation;
    determining, by the computing device, to hand over authority over the one or more components from the first worker process to a second worker process in the computer simulation;
    in response to determining to hand over authority over the one or more components from the first worker process to the second worker process, transmitting, by the computing device and to the first worker process, a message indicating that authority over the one or more components will change from the first worker process to the second worker process after a period of time;
    assigning, by the computing device and to the second worker process, authority over the one or more components of the plurality of components;
    transmitting, by the computing device and to the first worker process, a message indicating that the first worker process is not authoritative over the one or more components;
    transmitting, by the computing device and to the second worker process, a message indicating that the second worker process is authoritative over the one or more components; and
    running the computer simulation based on the second worker process being authoritative over the one or more components.

2. The method of claim 1, wherein the transmitting the message indicating that the first worker process is not authoritative over the one or more components and the transmitting the message indicating that the second worker process is authoritative over the one or more components are performed after determining that the period of time has ended.

3. The method of claim 1, further comprising:
    receiving, by the computing device and from the first worker process, a message indicating that the first worker process is ready to lose authority over the one or more components,
    wherein the transmitting the message indicating that the first worker process is not authoritative over the one or more components and the transmitting the message indicating that the second worker process is authoritative over the one or more components are performed in response to receiving the message indicating that the first worker process is ready to lose authority over the one or more components.

4. The method of claim 1, wherein the message indicating that authority over the one or more components will change from the first worker process to the second worker process after the period of time comprises an indication of an end time of the period of time.

5. The method of claim 1, further comprising:
    after assigning, to the first worker process, authority over the one or more components of the plurality of components and before determining to hand over authority over the one or more components from the first worker process to the second worker process:
        receiving, by the computing device and from the first worker process, an update to the one or more components of the plurality of components; and
        storing, by the computing device, the update to the one or more components of the plurality of components.

6. The method of claim 5, further comprising:
    after determining that the period of time has ended, transmitting, by the computing device and to the second worker process, the stored update to the one or more components of the plurality of components.

7. The method of claim 1, further comprising:
    during the period of time:
        receiving, by the computing device and from the first worker process, an update to the one or more components of the plurality of components; and
        storing, by the computing device, the update to the one or more components of the plurality of components.

8. The method of claim 7, further comprising:
    after assigning, to the second worker process, authority over the one or more components, transmitting, by the computing device and to the second worker process, the stored update to the one or more components of the plurality of components.

9. The method of claim 1, further comprising:
    receiving, by the computing device, data indicative of network conditions of a network associated with the computer simulation,
    wherein the determining to hand over authority over the one or more components from the first worker process to the second worker process is based on the network conditions of the network associated with the computer simulation.

10. An apparatus comprising:
    a processor; and
    memory storing computer-executable instructions that, when executed by the processor, cause the apparatus to:
        assign, to a first worker process in a computer simulation associated with the apparatus, authority over one or more components of a plurality of components, wherein the plurality of components are configured to indicate behaviors of a plurality of entities executing in the computer simulation;
        determine to hand over authority over the one or more components from the first worker process to a second worker process in the computer simulation;
        in response to determining to hand over authority over the one or more components from the first worker process to the second worker process, transmit, to the first worker process, a message indicating that authority over the one or more components will change from the first worker process to the second worker process after a period of time;

assign, to the second worker process, authority over the one or more components of the plurality of components;

transmit, to the first worker process, a message indicating that the first worker process is not authoritative over the one or more components;

transmit, to the second worker process, a message indicating that the second worker process is authoritative over the one or more components; and run the computer simulation based on the second worker process being authoritative over the one or more components.

11. The apparatus of claim 10, wherein the computer-executable instructions, when executed by the processor, cause the apparatus to transmit the message indicating that the first worker process is not authoritative over the one or more components and transmit the message indicating that the second worker process is authoritative over the one or more components after determining that the period of time has ended.

12. The apparatus of claim 10, wherein the computer-executable instructions, when executed by the processor, further cause the apparatus to:

receive, from the first worker process, a message indicating that the first worker process is ready to lose authority over the one or more components, and wherein the computer-executable instructions, when executed by the processor, cause the apparatus to transmit the message indicating that the first worker process is not authoritative over the one or more components and transmit the message indicating that the second worker process is authoritative over the one or more components in response to receiving the message indicating that the first worker process is ready to lose authority over the one or more components.

13. The apparatus of claim 10, wherein the message indicating that authority over the one or more components will change from the first worker process to the second worker process after the period of time comprises an indication of an end time of the period of time.

14. The apparatus of claim 10, wherein the computer-executable instructions, when executed by the processor, further cause the apparatus to:

after assigning, to the first worker process, authority over the one or more components of the plurality of components and before determining to hand over authority over the one or more components from the first worker process to the second worker process:

receive, from the first worker process, an update to the one or more components of the plurality of components; and store the update to the one or more components of the plurality of components.

15. The apparatus of claim 14, wherein the computer-executable instructions, when executed by the processor, further cause the apparatus to:

after determining that the period of time has ended, transmit, to the second worker process, the stored update to the one or more components of the plurality of components.

16. The apparatus of claim 10, wherein the computer-executable instructions, when executed by the processor, further cause the apparatus to:

during the period of time:

receive, from the first worker process, an update to the one or more components of the plurality of components; and store the update to the one or more components of the plurality of components.

17. The apparatus of claim 16, wherein the computer-executable instructions, when executed by the processor, further cause the apparatus to:

after assigning, to the second worker process, authority over the one or more components, transmit, to the second worker process, the stored update to the one or more components of the plurality of components.

18. The apparatus of claim 10, wherein the computer-executable instructions, when executed by the processor, further cause the apparatus to:

receive data indicative of network conditions of a network associated with the computer simulation, and wherein the computer-executable instructions, when executed by the processor, cause the apparatus to determine to hand over authority over the one or more components from the first worker process to the second worker process based on the network conditions of the network associated with the computer simulation.

19. A non-transitory computer-readable media storing computer-readable instructions that, when executed by a computing device, cause the computing device to:

assign, to a first worker process, authority over one or more components of a plurality of components, wherein the plurality of components are configured to indicate behaviors of a plurality of entities executing in a simulation associated with the computing device;

determine to hand over authority over the one or more components from the first worker process to a second worker process;

in response to determining to hand over authority over the one or more components from the first worker process to the second worker process, transmit, to the first worker process, a message indicating that authority over the one or more components will change from the first worker process to the second worker process after a period of time;

assign, to the second worker process, authority over the one or more components of the plurality of components;

transmit, to the first worker process, a message indicating that the first worker process is not authoritative over the one or more components;

transmit, to the second worker process, a message indicating that the second worker process is authoritative over the one or more components; and run the computer simulation based on the second worker process being authoritative over the one or more components.

20. The non-transitory computer-readable media of claim 19, wherein the computer-readable instructions, when executed by the computing device, cause the computing device to transmit the message indicating that the first worker process is not authoritative over the one or more components and transmit the message indicating that the second worker process is authoritative over the one or more components are performed after determining that the period of time has ended.

* * * * *